(12) United States Patent
Hoshi

(10) Patent No.: US 11,245,031 B2
(45) Date of Patent: Feb. 8, 2022

(54) SEMICONDUCTOR DEVICE

(71) Applicant: FUJI ELECTRIC CO., LTD., Kawasaki (JP)

(72) Inventor: Yasuyuki Hoshi, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 74 days.

(21) Appl. No.: 16/836,456

(22) Filed: Mar. 31, 2020

(65) Prior Publication Data

US 2020/0365726 A1    Nov. 19, 2020

(30) Foreign Application Priority Data

May 14, 2019   (JP) .............................. JP2019-091726

(51) Int. Cl.
| | |
|---|---|
| *H01L 29/78* | (2006.01) |
| *H01L 29/10* | (2006.01) |
| *H01L 29/06* | (2006.01) |
| *H01L 23/00* | (2006.01) |
| *G01R 19/165* | (2006.01) |
| *H01L 29/66* | (2006.01) |
| *H01L 27/02* | (2006.01) |

(52) U.S. Cl.
CPC .... *H01L 29/7815* (2013.01); *G01R 19/16571* (2013.01); *H01L 24/05* (2013.01); *H01L 27/0255* (2013.01); *H01L 29/0696* (2013.01); *H01L 29/1095* (2013.01); *H01L 29/66734* (2013.01); *H01L 29/7811* (2013.01); *H01L 29/7813* (2013.01)

(58) Field of Classification Search
None
See application file for complete search history.

(56) References Cited

U.S. PATENT DOCUMENTS

| | | | |
|---|---|---|---|
| 6,541,817 B1* | 4/2003 | Hurkx | H01L 29/0634 257/330 |
| 2017/0111037 A1 | 4/2017 | Shiigi et al. | |
| 2018/0183427 A1 | 6/2018 | Nakajima et al. | |
| 2019/0131443 A1 | 5/2019 | Hoshi et al. | |
| 2019/0189756 A1* | 6/2019 | Okumura | H01L 29/1095 |
| 2019/0371932 A1* | 12/2019 | Hashizume | H01L 29/66068 |

FOREIGN PATENT DOCUMENTS

| | | |
|---|---|---|
| JP | 2017-079324 A | 4/2017 |
| JP | 2018-107331 A | 7/2018 |
| WO | 2018/135147 A1 | 7/2018 |

* cited by examiner

*Primary Examiner* — Ali Naraghi
(74) *Attorney, Agent, or Firm* — Rabin & Berdo, P.C.

(57) ABSTRACT

A region of a portion directly beneath an OC pad is a sensing effective region in which unit cells of a current sensing portion are disposed. A p-type low-dose region is provided on a front surface of a semiconductor substrate and surrounds a periphery of the sensing effective region. The p-type low-dose region is fixed at an electric potential of a source pad of a main semiconductor element. The p-type low-dose region is disposed to be separated from a p-type base region of the sensing effective region by an n⁻-type region between the p-type low-dose region and the sensing effective region. A total dose of impurities in the p-type low-dose region is lower than a total dose of impurities in a p-type region of a front side of a semiconductor substrate in a main effective region in which unit cells of the main semiconductor element are disposed.

13 Claims, 19 Drawing Sheets

FIG. 22
RELATED ART

SEMICONDUCTOR DEVICE

CROSS REFERENCE TO RELATED APPLICATIONS

This application is based upon and claims the benefit of priority of the prior Japanese Patent Application No. 2019-091726, filed on May 14, 2019, the entire contents of which are incorporated herein by reference.

BACKGROUND OF THE INVENTION

1. Field of the Invention

Embodiments of the invention relate to a semiconductor device.

2. Description of the Related Art

Silicon (Si) is used as a material for power semiconductor devices that control high voltage and/or large current. There are several types of power semiconductor devices such as bipolar transistors, insulated gate bipolar transistors (IGBTs), and metal oxide semiconductor field effect transistors (MOSFETs) that have an insulated gate formed by a three-layered structure including a metal, an oxide film, and a semiconductor material. These devices are selectively used according to an intended purpose.

For example, bipolar transistors and IGBTs have high current density compared to MOSFETs, and can be adapted for large current but cannot be switched at high speeds. In particular, the limit of switching frequency is about several kHz for bipolar transistors and about several tens of kHz for IGBTs. On the other hand, power MOSFETs have low current density compared to bipolar transistors and IGBTs, and are difficult to adapt for large current but can be switched at high speeds up to about several MHz.

Further, MOSFETs structurally differ from IGBTs, have a built-in parasitic diode formed by a pn junction between a p-type base region and an n$^-$-type drift region, and may use this parasitic diode as a free-wheeling diode for protecting the MOSFET. Therefore, instances in in which a MOSFET is used as an inverter device are gaining attention in terms of being economical since no external free-wheeling diode needs to be connected to the MOSFET.

There is a strong demand in the market for large-current, high-speed power semiconductor devices. Thus, IGBTs and power MOSFETs have been intensively developed and improved, and the performance of power devices has substantially reached the theoretical limit determined by the material. In terms of power semiconductor devices, semiconductor materials to replace silicon have been investigated and silicon carbide (SiC) has been focused on as a semiconductor material enabling production (manufacture) of a next-generation power semiconductor device having low ON voltage, high-speed characteristics, and high-temperature characteristics.

Silicon carbide is chemically a very stable semiconductor material, has a wide bandgap of 3 eV, and can be used very stably as a semiconductor material even at high temperatures. Further, silicon carbide has a critical field strength that is at least ten times greater than the critical field strength of silicon and therefore, is expected to be a semiconductor material capable of sufficiently reducing ON resistance. Such characteristics of silicon carbide are shared by other wide bandgap semiconductor materials that have a bandgap wider than that of silicon (hereinafter, wide bandgap semiconductor material).

A structure of a conventional semiconductor device will described taking an n-channel MOSFET that uses silicon carbide (SiC) as a wide bandgap material as an example. FIG. 21 is a plan view of a layout when the conventional semiconductor device is viewed from a front side of a semiconductor substrate. In FIG. 21, a p-type base region 134$b$ of a sensing effective region 112$a$ and a p-type base region 134$b'$ of a main non-operating region 101$b$ are indicated by mutually differing hatching. FIG. 22 is a cross-sectional view of a structure of an active region in FIG. 21.

Figure 22:
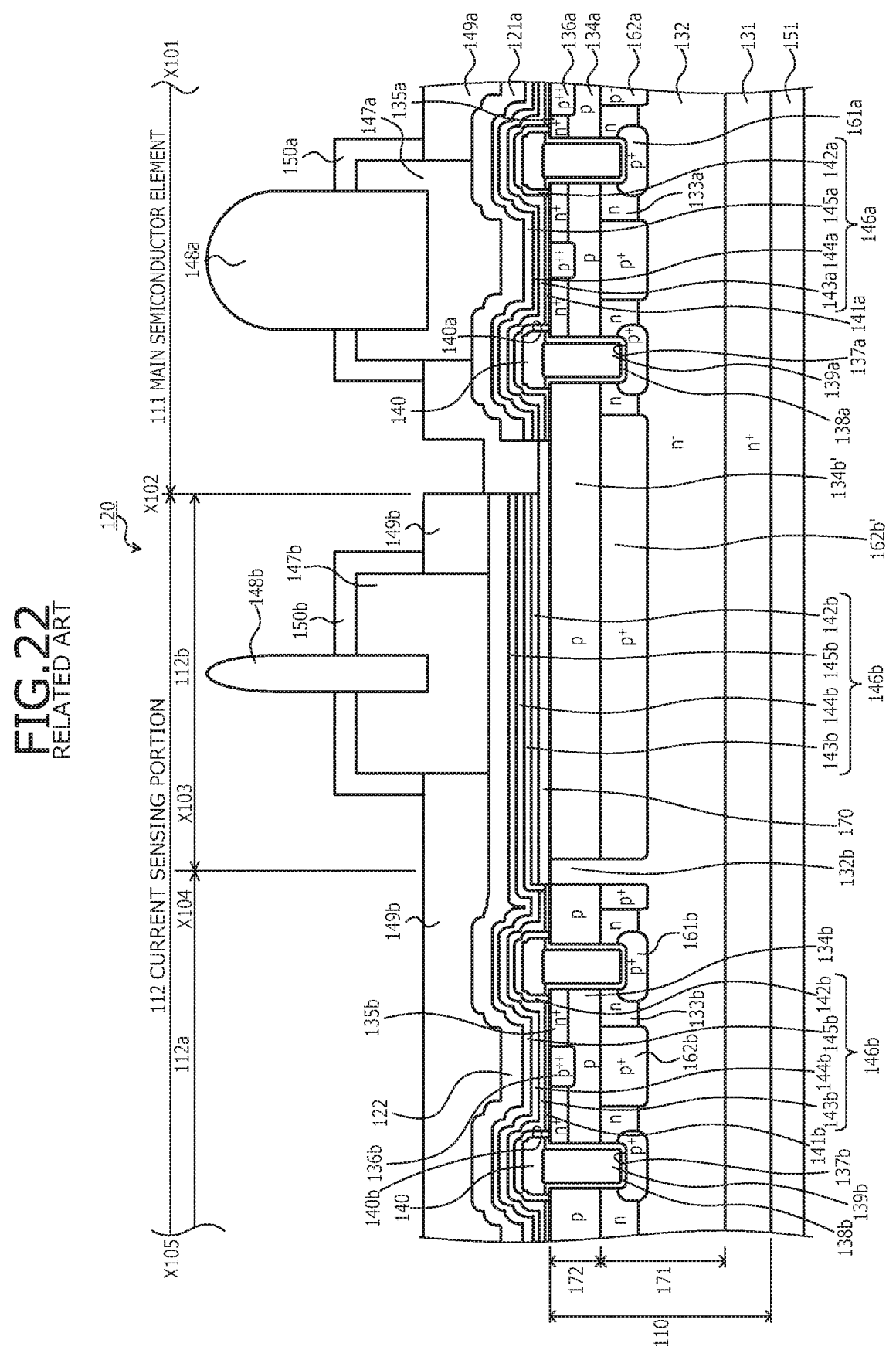

FIG. 22 depicts cross-sectional view of a structure of a main effective region 101$a$ and a current sensing portion 112 (cross-sectional view along cutting line X101-X102-X103-X104-X105). The p-type base region 134$b'$ and a p$^+$-type region 162$b'$ are provided directly beneath a sensing non-operating region 112$b$ and while cross-sectional views of the structure directly beneath a temperature sensing portion 113 and directly beneath a gate pad 121$b$ are not depicted, the p-type base region 134$b'$ and the p$^+$-type region 162$b'$ are provided similarly. A cross-sectional view of the structure of the temperature sensing portion 113 is also not depicted.

A conventional semiconductor device 120 depicted in FIGS. 21 and 22 has in an active region 101 of a single semiconductor substrate 110 containing silicon carbide, a main semiconductor element 111 and one or more circuit portions for protecting/controlling the main semiconductor element 111. The main semiconductor element 111 is a vertical MOSFET and is configured by plural unit cells (non-depicted functional units) disposed adjacent to one another in an effective region (hereinafter, main effective region) 101$a$ of the active region 101.

A source pad 121$a$ of the main semiconductor element 111 is provided on a front surface of the semiconductor substrate 110, in the main effective region 101$a$. The circuit portions for protecting/controlling the main semiconductor element 111 are disposed in a region (hereinafter, main non-operating region) 101$b$ of the active region 101, excluding the main effective region 101$a$. The main non-operating region 101$b$ is free of unit cells of the main semiconductor element 111.

A surface area of the main non-operating region 101$b$ is large as compared to a surface area of a main non-operating region of a semiconductor device (semiconductor device in which only a gate pad is disposed in the main non-operating region) without the circuit portions for protecting/controlling the main semiconductor element 111. The circuit portions for protecting/controlling the main semiconductor element 111, for example, may be high-function portions such as the current sensing portion 112, the temperature sensing portion 113, an over-voltage protecting portion (not depicted), and an arithmetic circuit portion (not depicted).

The current sensing portion 112 is a vertical MOSFET that includes unit cells having a configuration similar to a configuration of the unit cells (functional units of the element) of the main semiconductor element 111, of a quantity fewer than a quantity of the unit cells in the main semiconductor element 111. The current sensing portion 112 is disposed to be separate from the main semiconductor element 111. The current sensing portion 112 operates under conditions identical to those of the main semiconductor element 111 and detects overcurrent (OC) flowing in the main semiconductor element 111.

The unit cells of the current sensing portion 112 are disposed in a region (hereinafter, sensing effective region) 112a of a portion of the current sensing portion 112 directly beneath an electrode pad (hereinafter, OC pad) 122. A region (hereinafter, sensing non-operating region) 112b directly beneath the OC pad 122 and excluding the sensing effective region 112a is a region free of unit cells of the current sensing portion 112 and does not function as the current sensing portion 112.

In substantially the entire sensing non-operating region 112b, the p-type base region 134b' is provided in a surface region of the semiconductor substrate 110. The pt-type region 162b' is provided between the p-type base region 134b' and an n$^-$-type drift region 132. The p-type base region 134b' and the p$^+$-type region 162b' of the sensing non-operating region 112b are separated from the sensing effective region 112a to a greater extent than is an n$^-$-type region 132b of a surface region of the semiconductor substrate 110.

The p-type base region 134b' of the sensing non-operating region 112b is connected to a p-type base region 134a of the main semiconductor element 111 and is fixed at a source potential of the main semiconductor element 111. Further, the p-type base region 134b' and the p$^+$-type region 162b' of the sensing non-operating region 112b extend throughout a region, excluding the sensing effective region 112a of the main non-operating region 101b and are disposed directly beneath electrode pads other than the source pad 121a.

The electrode pads other than the source pad 121a are provided on the front surface of the semiconductor substrate 110, in the main non-operating region 101b. In FIG. 21, the source pad 121a, the gate pad 121b, the OC pad 122, and electrode pads (an anode pad 123a and a cathode pad 123b) of the temperature sensing portion 113 are indicated by "S", "G", "OC", "A", and "K", respectively. Reference numeral 102 is an edge termination region.

Reference characters 133a to 150a, 161a, 162a are parts of a trench-gate MOSFET configuring the main semiconductor element 111. Reference characters 133b to 150b, 161b, 162b are parts of a trench-gate MOSFET configuring the current sensing portion 112. Reference numerals 131, 132, 151, 170 are respectively an n$^+$-type drain region, an n$^-$-type drift region, a drain electrode, and a field insulating film common to the main semiconductor element 111 and the current sensing portion 112.

Further, as compared to a planar gate structure in which a channel is formed along the front surface of the semiconductor substrate accompanying large current, a trench gate structure in which a channel (inverse layer) is formed in a direction orthogonal to the front surface of the semiconductor substrate, along a side wall of a trench is advantageous in terms of cost. A reason for this is that a trench gate structure enables unit cell (configuration unit of an element) density per unit area to be increased and thereby, enables current density per unit area to be increased.

A rate of temperature rise relative to a volume occupied by the unit cells increases by an extent to which device current density is increased and therefore, to enhance discharge efficiency and stabilize reliability, a double-sided cooling structure is necessary. Further, with consideration of reliability, on a single semiconductor substrate with a vertical MOSFET that is a main semiconductor element, a high-function structure in which high-function portions such as the current sensing portion, the temperature sensing portion, and the over-voltage protecting portion have to be disposed as circuit portions for protecting/controlling a main semiconductor element.

As an example of a conventional semiconductor device, devices have been proposed that include a main non-operating region in which high-function portions such as a current sensing portion, a temperature sensing portion, and an over-voltage protecting portion are provided, the main non-operating region being provided on a single semiconductor substrate having a main semiconductor element that has a planar gate structure (for example, refer to Japanese Laid-Open Patent Publication No. 2017-079324 and International Publication No. WO 2018/135147). In Japanese Laid-Open Patent Publication No. 2017-079324 and International Publication No. WO 2018/135147, a configuration is disclosed in which electrode pads other than a source pad and an OC pad are collectively disposed at one edge of the semiconductor substrate.

As another example of the conventional semiconductor device, a semiconductor device having plural current sensing portions and main semiconductor elements having a trench gate structure provided on a single semiconductor substrate has been proposed in which the current sensing portions are respectively disposed in the main semiconductor elements (for example, refer to Japanese Laid-Open Patent Publication No. 2018-107331). In Japanese Laid-Open Patent Publication No. 2018-107331, a configuration is disclosed in which OC pads of the current sensing portions are disposed collectively at one edge of the semiconductor substrate.

SUMMARY OF THE INVENTION

According to an embodiment of the invention, a semiconductor device includes a semiconductor substrate containing a semiconductor material having a bandgap wider than that of silicon, and having a first main surface and a second main surface opposite to the first main surface, the semiconductor substrate having first and second effective regions and a non-operating region that excludes the first and second effective regions, a first first-conductivity-type region of a first conductivity type, provided in the semiconductor substrate; a first second-conductivity-type region of a second conductivity type, provided between the first main surface of the semiconductor substrate and the first first-conductivity-type region, a first insulated gate field effect transistor, provided in the first effective region and having the first first-conductivity-type region as a drift region and the first second-conductivity-type region as a base region, the first insulated gate field effect transistor being constituted by a plurality of unit cells each having a cell structure, a first source pad of the first insulated gate field effect transistor, provided on the first main surface of the semiconductor substrate and electrically connected to the first second-conductivity-type region, a second second-conductivity-type region of the second conductivity type, provided between the first main surface of the semiconductor substrate and the first first-conductivity-type region, in a region of the semiconductor substrate different from the first second-conductivity-type region, a second insulated gate field effect transistor, provided in the second effective region, and having the first first-conductivity-type region as a drift region and having the second second-conductivity-type region as a base region, the second insulated gate field effect transistor being constituted by a plurality of unit cells each having a cell structure that is the same as the cell structure of the each of the plurality of unit cells of the first insulated gate field effect transistor, a total number of the plurality of unit cells of the second insulated gate field effect transistor being smaller than a total number of the plurality of unit cells of the first insulated gate field effect transistor, a second source pad of the second insulated gate field effect transistor, provided on the first main surface of the semiconductor substrate, and disposed to be separate from the first source pad and electrically connected to the second second-conductivity-type region, a third second-conductivity-type region of the second conductivity type, provided in the non-operating region, between the first main surface of the semiconductor substrate and the first first-conductivity-type region, and electrically connected to the first second-conductivity-type region, the third second-conductivity-type region being separate from the second effective region and surrounding a periphery of the second effective region, a drain electrode common to the first insulated gate field effect transistor and the second insulated gate field effect transistor, the drain electrode being electrically connected to the second main surface of the semiconductor substrate, and a fourth second-conductivity-type region of the second conductivity type, provided between the first main surface of the semiconductor substrate and the first first-conductivity-type region, the fourth second-conductivity-type region configuring the plurality of unit cells of first insulated gate field effect transistor and having a total dose of impurities that is higher than a total dose of impurities in the third second-conductivity-type region.

In the embodiment, the fourth second-conductivity-type region includes the first second-conductivity-type region.

In the embodiment, the semiconductor device further includes a plurality of trenches each penetrating the first second-conductivity-type region from the first main surface of the semiconductor substrate and reaching the first first-conductivity-type region; and a plurality of second-conductivity-type high-concentration regions of the second conductivity type, respectively provided between trenches that are adjacent to one another among the plurality of trenches and between the first second-conductivity-type region and the first first-conductivity-type region so as to be in contact with the first second-conductivity-type region and the first first-conductivity-type region, each of the plurality of second-conductivity-type high-concentration regions having an impurity concentration that is higher than an impurity concentration of the first second-conductivity-type region. The fourth second-conductivity-type region is configured by the first second-conductivity-type region and the plurality of second-conductivity-type high-concentration regions.

In the embodiment, the total dose of impurities in the third second-conductivity-type region is at most 15% of the total dose of impurities in the fourth second-conductivity-type region.

In the embodiment, the total dose of impurities in the third second-conductivity-type region is at most 5% of the total dose of impurities in the fourth second-conductivity-type region.

In the embodiment, the third second-conductivity-type region has: a fifth second-conductivity-type region surrounding a periphery of the second effective region, and a sixth second-conductivity-type region in contact with the fifth second-conductivity-type region and surrounding a periphery of the fifth second-conductivity-type region. The fifth second-conductivity-type region has a total dose of impurities that is lower than a total dose of impurities in the sixth second-conductivity-type region.

In the embodiment, the total dose of impurities in the fifth second-conductivity-type region is lower than the total dose of impurities in the fourth second-conductivity-type region.

In the embodiment, the total dose of impurities in the fifth second-conductivity-type region is at most 15% of the total dose of impurities in the fourth second-conductivity-type region.

In the embodiment, the total dose of impurities in the fifth second-conductivity-type region is at most 5% of the total dose of impurities in the fourth second-conductivity-type region.

In the embodiment, the semiconductor device further includes a second first-conductivity-type region of the first conductivity-type, provided between the second second-conductivity-type region and the third second-conductivity-type region, the second first-conductivity-type region surrounding a periphery of the second second-conductivity-type region.

In the embodiment, the semiconductor device further includes at least one electrode pad provided on the first main surface of the semiconductor substrate, in the non-operating region, the least one electrode pad being provided to be separate from the first source pad and the second source pad. The third second-conductivity-type region spans an entire area of a region of the non-operating region excluding the second first-conductivity-type region, the third second-conductivity-type region being positioned directly beneath the at least one electrode pad.

In the embodiment, a distance between the second second-conductivity-type region and the third second-conductivity-type region is at least 0.1 μm.

In the embodiment, the second effective region corresponds to a part of a region directly beneath the second source pad, and the third second-conductivity-type region is provided in a region directly beneath the second source pad, excluding the second effective region.

In the embodiment, the second insulated gate field effect transistor detects overcurrent flowing in the first insulated gate field effect transistor.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 22 is a cross-sectional view of a structure of an active region in FIG. 21.

DETAILED DESCRIPTION OF THE INVENTION

Figure 1:
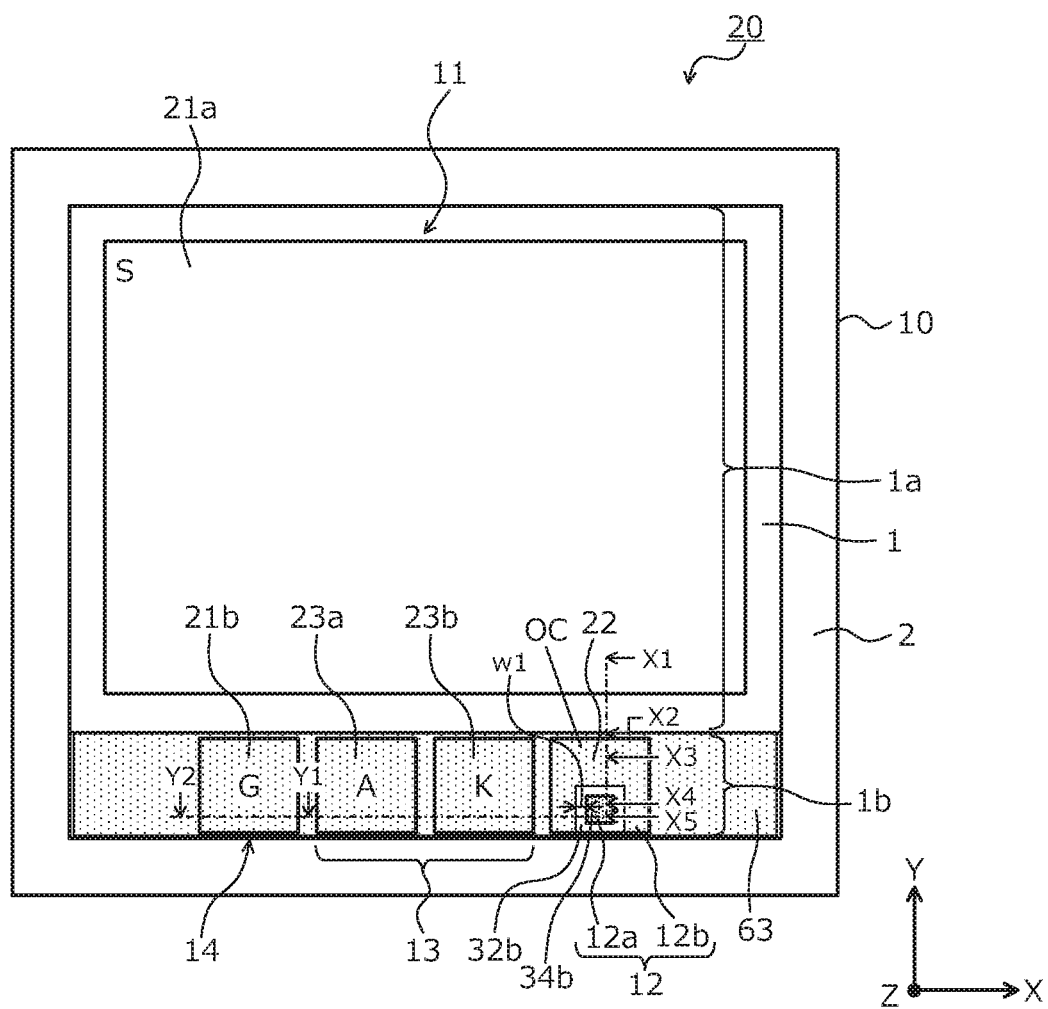
FIG. 1 is a plan view of a layout when a semiconductor device according to a first embodiment is viewed from a front side of a semiconductor substrate.

First, problems associated with the conventional techniques will be discussed. In the conventional semiconductor device 120, the p-type base region 134b' of the main non-operating region 101b is electrically connected to the source potential of the main semiconductor element 111, whereby a parasitic diode is formed by pn junctions between the p$^+$-type region 162b' and the p-type base region 134b' of the main non-operating region 101b and the n$^-$-type drift region. The p-type base region 134b' of the sensing non-operating region 112b expands spanning substantially the entire area of the main non-operating region 101b, excluding the sensing effective region 112a and therefore, as the surface area of the main non-operating region 101b increases, the operating region of the parasitic diode formed by the p-type base region 134b' of the main non-operating region 101b increases.

When the conventional semiconductor device 120 is equipped having a switching configuration in a circuit device, the parasitic diode formed by the p-type base region 134b' of the main non-operating region 101b turns OFF together with a parasitic diode formed by a pn junction between the p-type base region 134a of the main semiconductor element 111 and the n$^-$-type drift region 132, when the main semiconductor element 111 switches from OFF to ON. Here, positive holes (holes) generated by the main non-operating region 101b flow into the sensing effective region 112a and hole current (reverse recovery current) concentrates in the current sensing portion 112. Therefore, as the surface area of the main non-operating region 101b increases, large current flows to and concentrates in the current sensing portion 112, whereby the current sensing portion 112 become susceptible to destruction.

Embodiments of a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −, and represents one example. In the description of the embodiments below and the accompanying drawings, main portions that are identical will be given the same reference numerals and will not be repeatedly described.

A semiconductor device according to a first embodiment is configured using a semiconductor (wide bandgap material) having a bandgap wider than that of silicon (Si) as a semiconductor material. A structure of the semiconductor device according to the first embodiment will be described taking, as an example, a case in which, for example, silicon carbide (SiC) is used as a wide bandgap material. FIG. 1 is a plan view of a layout when the semiconductor device according to the first embodiment is viewed from a front side of a semiconductor substrate. In FIG. 1, a p-type base region (second second-conductivity-type region) 34b of a sensing effective region (second effective region) 12a and a p$^-$-type low-dose region (third second-conductivity-type region) 63 of a main non-operating region 1b are depicted in mutually different hatching (Similarly in FIGS. 12 to 17).

A semiconductor device 20 according to the first embodiment and depicted in FIG. 1 has a main semiconductor element (first insulated gate field effect transistor) 11 and one or more circuit portions for protecting/controlling the main semiconductor element 11, in an active region 1 of a single semiconductor substrate (semiconductor chip) 10. The main semiconductor element 11 is a vertical MOSFET in which in an ON state, drift current flows in a depth direction Z of a semiconductor substrate 10. The main semiconductor element 11 is configured by plural unit cells (functional units of the element) connected in parallel by a source pad (first source pad) 21a.

The unit cells of the main semiconductor element 11 are disposed adjacent to one another in a direction parallel to a front surface of the semiconductor substrate 10. The main semiconductor element 11 performs a main operation of the semiconductor device 20 according to the first embodiment. The main semiconductor element 11 is disposed in an effective region (main effective region: first effective region) 1a of the active region 1. The main effective region 1a is a region through which a main current of the main semiconductor element 11 flows when the main semiconductor element 11 is ON. The main effective region 1a, for example, has a substantially rectangular planar shape and occupies most of the surface area of the active region 1.

The circuit portions for protecting/controlling the main semiconductor element 11, for example, are high-function portions such as a current sensing portion (second insulated gate field effect transistor) 12, a temperature sensing portion 13, an over-voltage protecting portion (not depicted), and an arithmetic circuit portion (not depicted), and are disposed in the main non-operating region 1b of the active region 1. The main non-operating region 1b is a region free of unit cells of the main semiconductor element 11 and does not function as the main semiconductor element 11. The main non-operating region 1b, for example, has a substantially rectangular planar shape, and is disposed between the main effective region 1a and an edge termination region 2.

The edge termination region 2 is a region between the active region 1 and an edge of the semiconductor substrate 10, surrounds a periphery of the active region 1, mitigates electric field at the front side of the semiconductor substrate 10, and sustains a breakdown voltage. In the edge termination region 2, for example, a voltage withstanding structure (not depicted) such as a field limiting ring (FLR), a junction termination extension (JTE) structure, etc. is disposed. The breakdown voltage is a voltage limit at which no errant operation or destruction of the element occurs.

The source pad (electrode pad) 21a of the main semiconductor element 11 is disposed on the front surface of the semiconductor substrate 10, in the main effective region 1a. The main semiconductor element 11 has a greater current capacity as compared to other circuit portions. Therefore, the source pad 21a of the main semiconductor element 11 has a planar shape substantially like that of the main effective region 1a and covers substantially an entire area of the main effective region 1a. The source pad 21a of the main semiconductor element 11 is disposed to be separate from electrode pads other than the source pad 21a.

The electrode pads other than the source pad 21a are disposed to be separate from the edge termination region 2 and to be separate from one another, on the front surface of the semiconductor substrate 10 in the main non-operating region 1b. The electrode pads other than the source pad 21a are the gate pad 21b of the main semiconductor element 11, an electrode pad (hereinafter, OC pad (second source pad)) 22 of the current sensing portion 12, electrode pads (hereinafter, anode pad and cathode pad) 23a, 23b of the temperature sensing portion 13, an electrode pad (hereinafter, OV pad (not depicted)) of the over-voltage protecting portion, and an electrode pad (not depicted) of the arithmetic circuit portion.

The electrode pads other than the source pad 21a, for example, have a substantially rectangular planar shape and a surface area necessary for bonding terminal pins 48b, 48c described hereinafter, wiring, etc. FIG. 1 depicts a case in which the electrode pads other than the source pad 21a are disposed in a row along a border between the main non-operating region 1b and the edge termination region 2 (similarly in FIGS. 12 to 17). Further, in FIG. 1, the source pad 21a, the gate pad 21b, the OC pad 22, the anode pad 23a, and the cathode pad 23b are depicted in rectangular shapes indicated by "S", "G", "OC", "A", and "K", respectively (similarly in FIGS. 12 to 17). In FIGS. 12, 13, 15, and 16, only "S", "G", and "OC" are depicted.

The current sensing portion 12 operates under conditions similar to those of the main semiconductor element 11 and has a function of detecting overcurrent (OC) flowing in the main semiconductor element 11. The current sensing portion 12 is disposed to be separate from the main semiconductor element 11. The current sensing portion 12 is a vertical MOSFET that includes unit cells having a configuration similar to those of the main semiconductor element 11, of a quantity (total number) (for example, about 10) lower than a quantity (for example, about 10,000) of the unit cells of the main semiconductor element 11, and that has a surface area smaller than a surface area of the main semiconductor element 11.

The unit cells of the current sensing portion 12 are disposed in a region (hereinafter, sensing effective region) 12a of a portion directly beneath the OC pad 22. The sensing effective region 12a, for example, has a rectangular planar shape. Unit cells of the current sensing portion 12 are disposed adjacent to one another along a direction parallel to the front surface of the semiconductor substrate 10. The direction along which the unit cells of the current sensing portion 12 are adjacent to one another, for example, is a same direction along which the unit cells of the main semiconductor element 11 are adjacent to one another. The unit cells of the current sensing portion 12 are connected in parallel to one another by the OC pad 22.

A surface area of the sensing effective region 12a is at most 1/1000 of a surface area of the main effective region 1a and may be at most 1/10000 thereof. As surface areas of the sensing effective region 12a and the main effective region 1a, a total mathematical area of n⁺-type source regions 35b, 35a described hereinafter included in the sensing effective region 12a and the main effective region 1a may be used. Further, as the surface areas of the sensing effective region 12a and the main effective region 1a, a total quantity of unit cells included in the sensing effective region 12a and the main effective region 1a may be used.

A reason that a ratio of the surface area of the sensing effective region 12a to the surface area of the main effective region 1a is set as described above is as follows. As the surface area of the sensing effective region 12a increases, conduction loss due to ON resistance of the current sensing portion 12 increases. By setting the ratio of the surface area of the sensing effective region 12a to the surface area of the main effective region 1a in the ranges described above, the conduction loss of the current sensing portion 12 may be reduced to an extent of being negligible with respect to the overall conduction loss of the semiconductor device 20 according to the first embodiment.

Further, directly beneath the OC pad 22, a region excluding the sensing effective region 12a is a sensing non-operating region 12b that does not function as the current sensing portion 12. In the sensing non-operating region 12b, no unit cells of the current sensing portion 12 are disposed. In substantially an entire area of the sensing non-operating region 12b, the p-type low-dose region 63 is provided in a surface region of the front surface of the semiconductor substrate 10. The p-type low-dose region 63 is disposed to be separate from the sensing effective region 12a and surrounds a periphery of the sensing effective region 12a in a substantially rectangular shape.

The p-type low-dose region 63, for example, spans substantially the entire area of the main non-operating region 1b, excluding the sensing effective region 12a and is further disposed directly beneath the electrode pads other than the source pad 21a. The p-type low-dose region 63 has a function of making electric field at the front surface of the semiconductor substrate 10 uniform and enhancing breakdown voltage, in a region that excludes the sensing effective region 12a of the main non-operating region 1b and in which substantially an entire area the front surface of the semiconductor substrate 10 is covered by an insulating film (field insulating film 70 described hereinafter, refer to FIGS. 2 and 3).

The p-type low-dose region 63 is connected to a p-type base region (first second-conductivity-type region) 34a of the main semiconductor element 11 and is fixed at a source electric potential of the main semiconductor element 11. Therefore, the p-type low-dose region 63 forms a parasitic diode 16 (16b) of the main semiconductor element 11 in the main non-operating region 1b by a pn junction formed with an n⁻-type drift region (first first-conductivity-type region) 32. As a surface area of the p-type low-dose region 63 increases, forward voltage of the parasitic diode 16b formed in the main non-operating region 1b may be increased.

A non-depicted n⁻-type region of a surface region of the semiconductor substrate 10 separates the p-type low-dose region 63 and a p-type region (not depicted) for element separation. The p-type region for element separation is provided in the edge termination region 2, in a substantially rectangular shape surrounding a periphery of the active region 1, and is a floating p-type region that forms a pn junction with the n⁻-type drift region 32 and thereby, forms a parasitic diode that electrically separates the active region 1 and the edge termination region 2.

Separation of the p-type low-dose region 63 and the p-type region for element separation enables positive holes to be prevented from concentrating in the current sensing portion 12. The positive holes are generated by the n⁻-type drift region 32 of the edge termination region 2 when the parasitic diode 16b formed by the pn junction between the p-type low-dose region 63 and the n⁻-type drift region 32 turns OFF and flow from a back side of the semiconductor substrate 10 into the main non-operating region 1b.

An n⁻-type region (second first-conductivity-type region) 32b further separates the p-type low-dose region 63 and the p-type base region 34b of the sensing effective region 12a. The n⁻-type region 32b is disposed between the p-type low-dose region 63 and the p-type base region 34b of the sensing effective region 12a, and surrounds a periphery of the sensing effective region 12a in a substantially rectangular shape. A distance w1 between the p-type low-dose region 63 and the p-type base region 34b of the sensing effective region 12a is, for example, at least 0.1 µm and may be as short as possible. A reason for this is as follows.

As the distance w1 between the p-type low-dose region 63 and the p-type base region 34b of the sensing effective region 12a increases, a surface area of the n⁻-type region 32b disposed between the p-type low-dose region 63 and the p-type base region 34b increases. Electric field locally concentrates in the field insulating film 70 in a portion covering the n⁻-type region 32b and the breakdown voltage decreases; therefore, the distance w1 is set as short as possible and the surface area of the n⁻-type region 32b is set as small as possible, thereby enabling decreases in the breakdown voltage in the main non-operating region 1b to be suppressed.

The p-type low-dose region 63 may be configured by one p-type region or may be configured by plural p-type regions having differing p-type impurity concentrations. A total dose about of the p-type low-dose region 63 is lower than a total dose of impurities in a p-type region (fourth second-conductivity-type region) of the front side of the semiconductor substrate 10 in the main effective region 1a. The total dose of impurities in the p-type region of the front side of the semiconductor substrate 10 in the main effective region 1a is an integral value (p-type impurity amount) per unit volume of a p-type impurity included in the p-type region configured by the p-type base region 34a and second p⁺-type regions (second-conductivity-type high-concentration region) 62a (refer to FIGS. 2 and 3) described hereinafter of a unit cell of the main semiconductor element 11.

A p-type impurity of p⁺⁺-type contact regions 36a of the main semiconductor element 11 is not included in the total dose of the p-type region of the front side of the semiconductor substrate 10 in the main effective region 1a. A unit cell of the main semiconductor element 11 is configured by a portion between a pair of trenches 37a adjacent to one another. The total dose of the p-type low-dose region 63 is an integral value per unit volume (p-type impurity amount) of a p-type impurity included in the p-type low-dose region 63 configured by one or more p-type regions. A p-type impurity of a p⁺⁺-type contact region 36c described hereinafter is not included in the total dose of the p-type low-dose region 63.

In particular, the total dose of the p-type low-dose region 63, for example, may be about 5% or less of the total dose of the p-type region of the front side of the semiconductor substrate 10 in the main effective region 1a. Variation of the total dose of the p-type low-dose region 63 due to ion implantation is permissible from the suitable range above to about a 10% increase of the total dose of the p-type region of the front side of the semiconductor substrate 10 in the main effective region 1a. In other words, the total dose of the p-type low-dose region 63, for example, is at most about 15% of the total dose of the p-type region of the front side of the semiconductor substrate 10 in the main effective region 1a and may be at most about 5% thereof.

The total dose of the p-type low-dose region 63 suffices to be within the range described above and a depth of the p-type low-dose region 63 may be variously changed. In this manner, the p-type low-dose region 63 is provided in the main non-operating region 1b, thereby enabling positive hole (hole) current generated by the main effective region 1a to be suppressed from flowing excessively to the p-type base region 34b of the sensing effective region 12a when a parasitic diode 17 (refer to FIG. 5) of the current sensing portion 12 turns OFF. As a result, electric field applied to the current sensing portion 12 may be mitigated, thereby enabling reverse recovery resistance of the parasitic diode 17 of the current sensing portion 12 to be increased.

The temperature sensing portion 13 has a function of detecting a temperature of the main semiconductor element 11 by using diode temperature characteristics. The temperature sensing portion 13 is disposed directly beneath the anode pad 23a and the cathode pad 23b. The temperature sensing portion 13, for example, may be configured by a polysilicon (poly-Si) layer provided on a field insulating film 70 on the front surface of the semiconductor substrate 10, or may be formed by a pn junction between a p-type region and an n-type region formed in the semiconductor substrate 10.

The over-voltage protecting portion (not depicted), for example, is a diode that protects the main semiconductor element 11 from overvoltage (OV) such as surges. The current sensing portion 12, the temperature sensing portion 13, and the over-voltage protecting portion are controlled by the arithmetic circuit portion. The main semiconductor element 11 is controlled based on output signals from the current sensing portion 12, the temperature sensing portion 13, and the over-voltage protecting portion. The arithmetic circuit portion is configured by plural semiconductor elements such as complementary MOS (CMOS) circuits.

Figure 2:
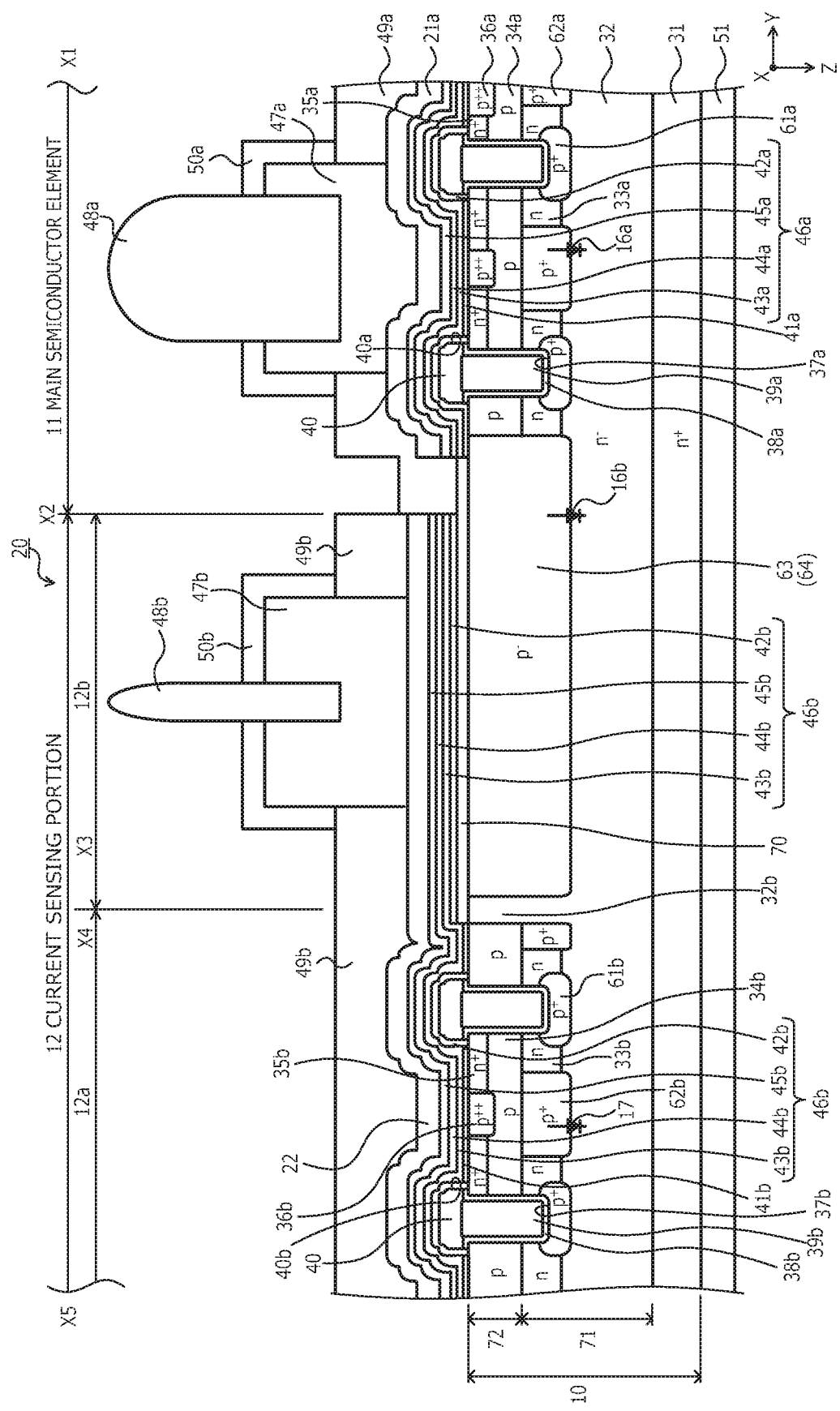
FIG. 2 is a cross-sectional view of a structure of an active region in FIG. 1.
Figure 3:
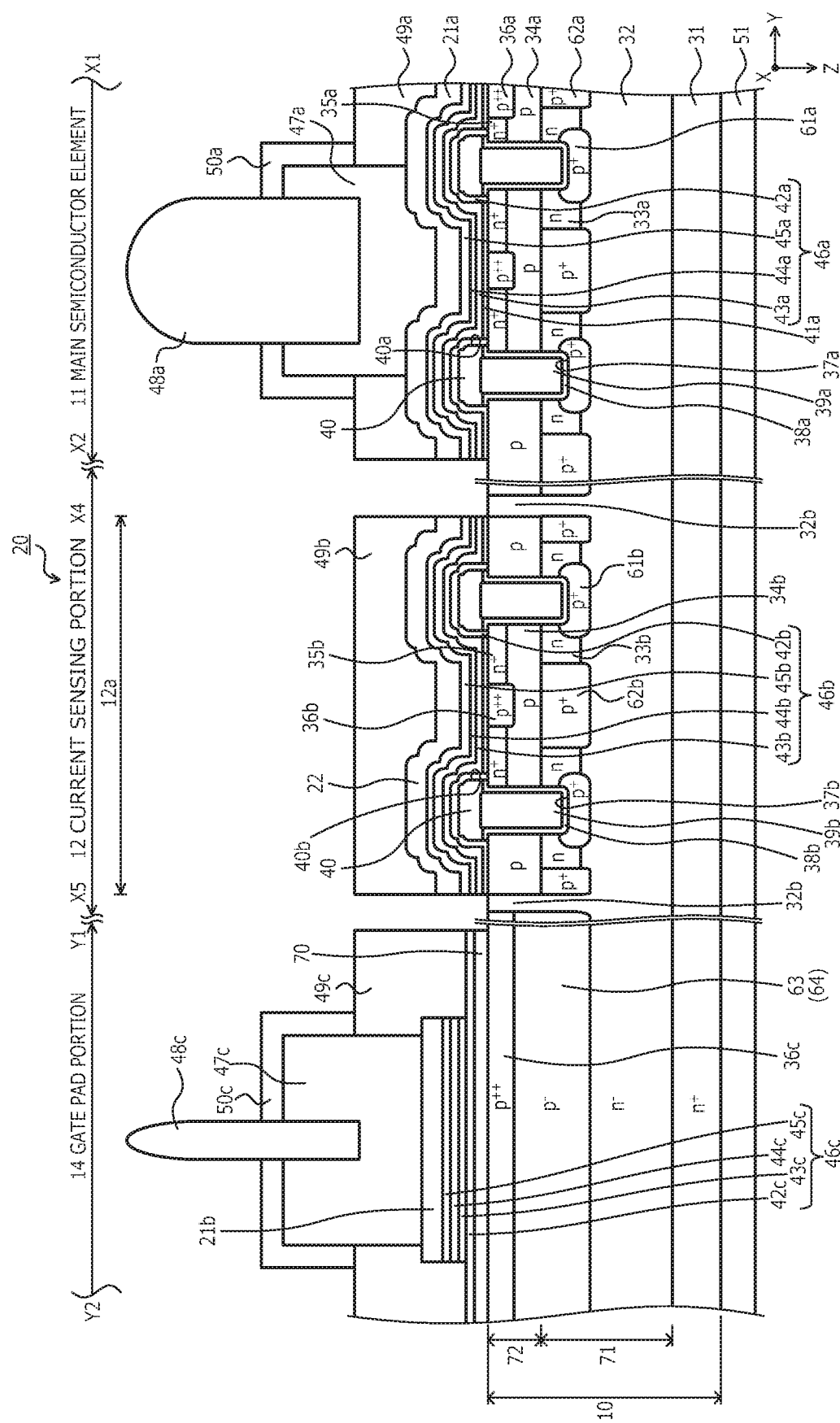
FIG. 3 is a cross-sectional view of the structure of the active region in FIG. 1.
Figure 4:
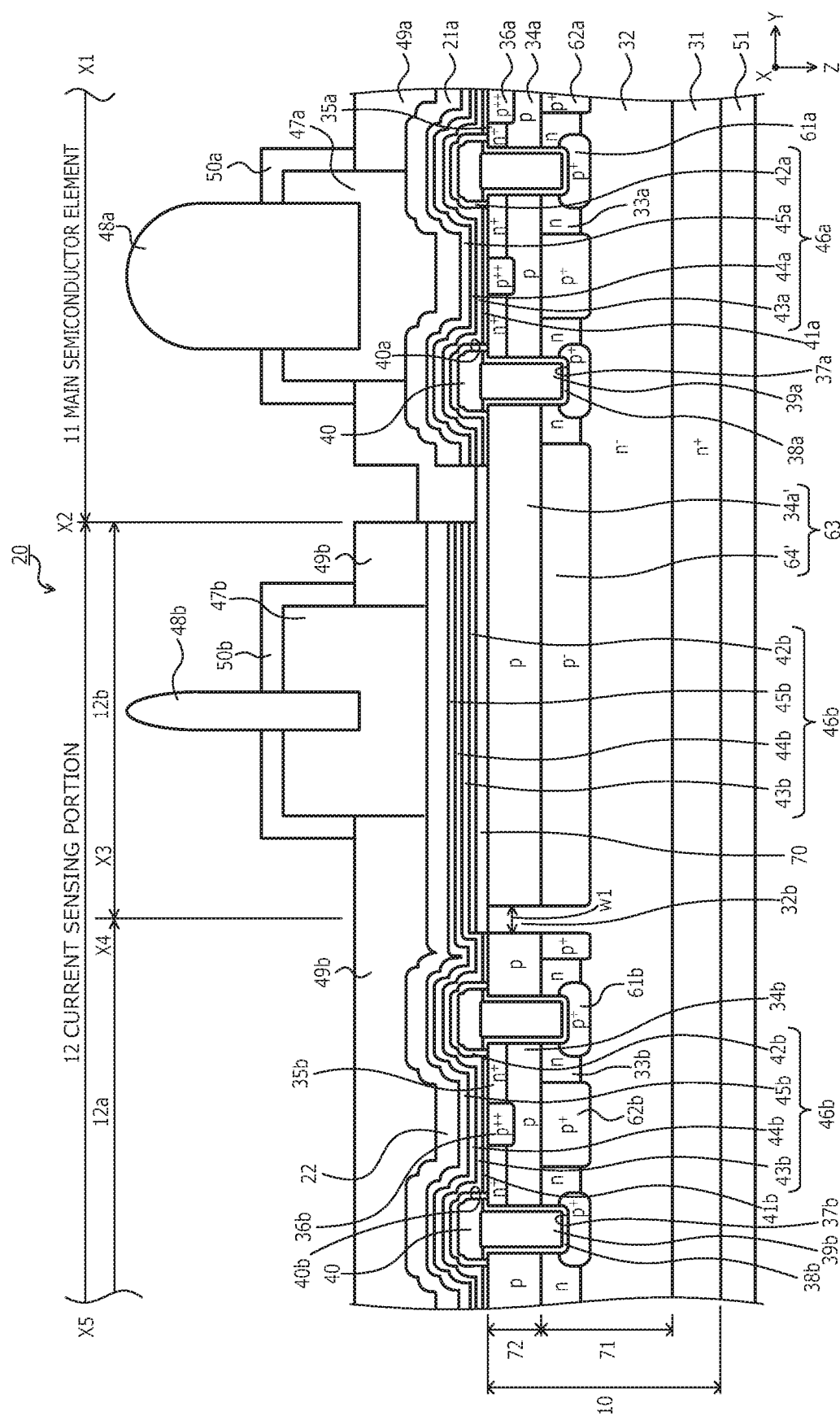
FIG. 4 is a cross-sectional view of another example of the structure of the active region in FIG. 1.

A cross-section of a structure of the active region 1 of the semiconductor device 20 according to the first embodiment will be described. FIGS. 2 and 3 are cross-sectional views of the structure of the active region in FIG. 1. FIG. 4 is a cross-sectional view of another example of the structure of the active region in FIG. 1. FIGS. 2 and 4 depict a cross-section (along cutting line X1-X2-X3-X4-X5) of the structure of the main effective region 1a and the current sensing portion 12. FIG. 3 depicts a cross-section (along cutting line X1-X2, cutting line X4-X5, and cutting line Y1-Y2) of the structure of the main effective region 1a, the sensing effective region 12a, and the temperature sensing portion 13.

Figure 18:
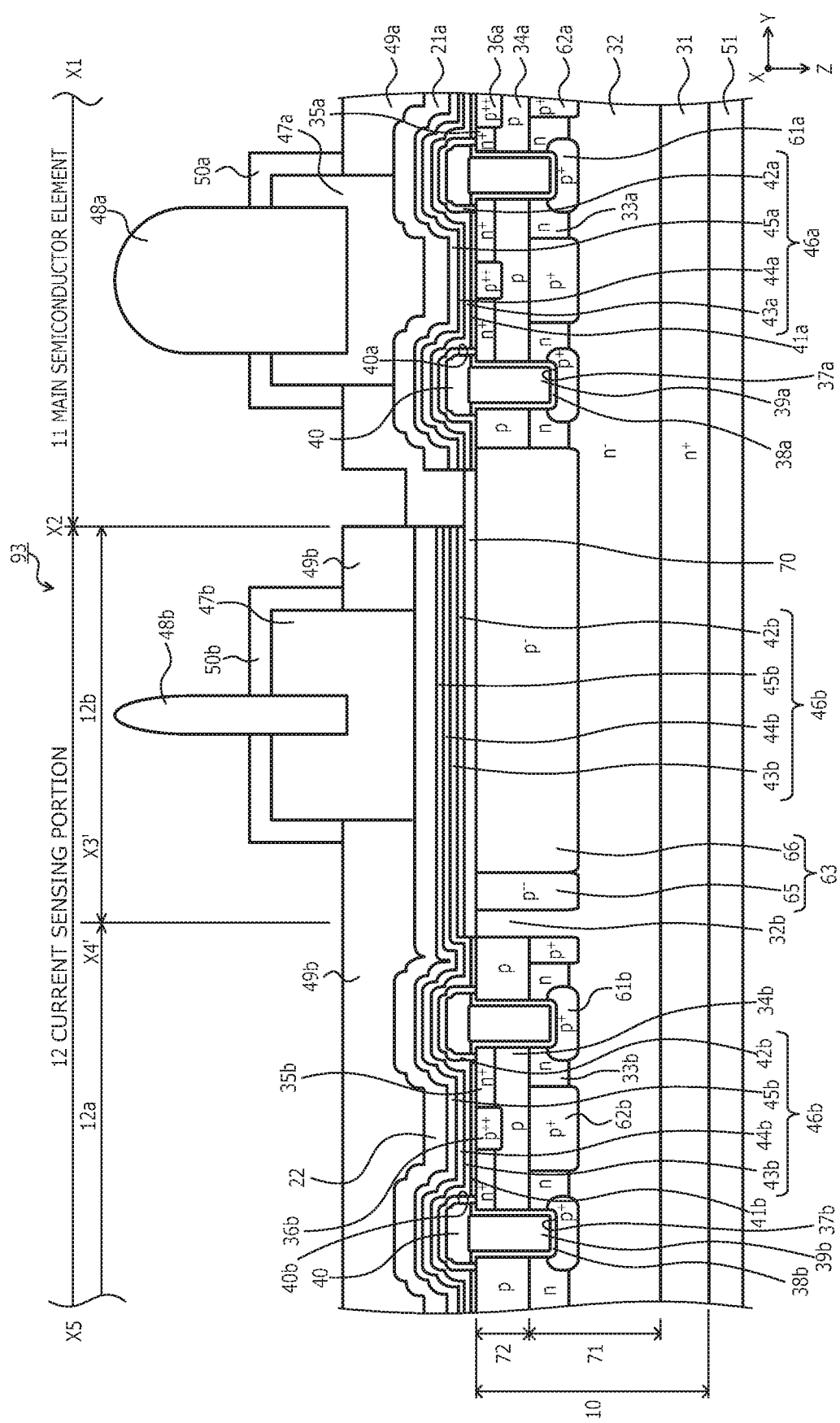
FIG. 18 is a cross-sectional view of a structure of the active region in FIG. 17.
Figure 19:
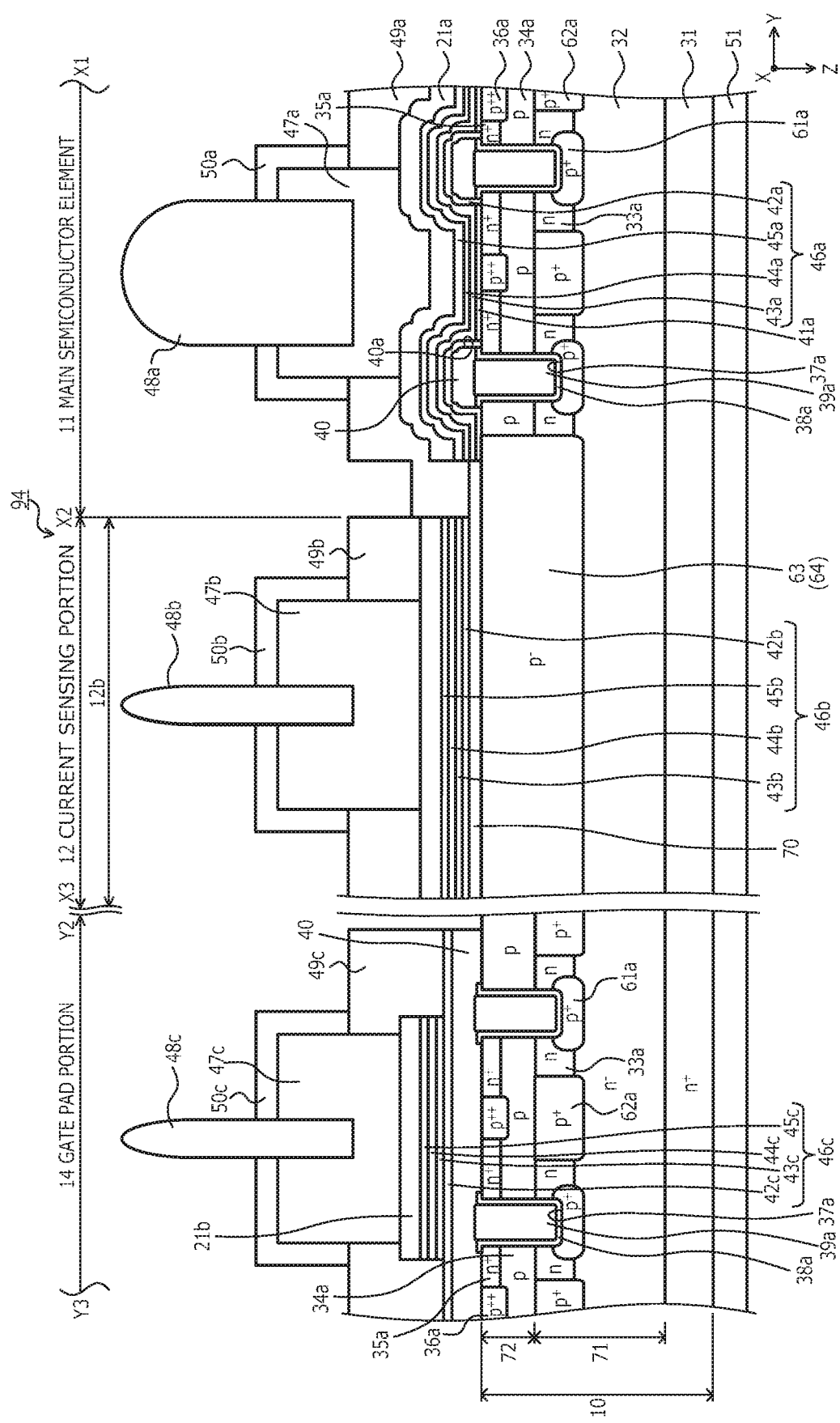
FIG. 19 is a cross-sectional view of a configuration of a semiconductor device according to a sixth embodiment.

In FIGS. 2 to 4, while only some of the respective unit cells in the main effective region 1a and in the sensing effective region 12a are depicted, all of the unit cells of the main effective region 1a and the sensing effective region 12a have the same configuration (similarly in FIGS. 18 and 19). Further, in FIGS. 2 to 4, while a cross-sectional view of the structure directly beneath the anode pad 23a and the cathode pad 23b of the temperature sensing portion 13 is not depicted, a cross-section of the structure directly beneath the anode pad 23a and the cathode pad 23b is similar to that directly beneath the gate pad 21b. In FIG. 3, the sensing non-operating region 12b between the main effective region 1a and the sensing effective region 12a is not depicted.

The main semiconductor element 11 is a vertical MOSFET that includes a MOS gate (insulated gate formed by a 3-layer structure including a metal, an oxide film, and a semiconductor) on the front side of the semiconductor substrate 10, in the main effective region 1a. Here, while a case in which the main semiconductor element 11 and the circuit portions that protect and control the main semiconductor element 11 have wiring structures of a similar configuration that uses pin-shaped wiring members (terminal pins 48a to 48c described hereinafter) is described as an example, instead of the pin-shaped wiring members, each may have a wiring structure that uses wires.

The semiconductor substrate 10 is an epitaxial substrate in which silicon carbide layers 71, 72 that become the n$^-$-type drift region 32 and the p-type base region 34a are sequentially formed by epitaxial growth on an n$^+$-type starting substrate 31 containing silicon carbide. The main semiconductor element 11 has general MOS gates configured by the p-type base region 34a, the n$^+$-type source regions 35a, the p$^{++}$-type contact regions 36a, the trenches 37a, a gate insulating film 38a, and gate electrodes 39a provided at the front side of the semiconductor substrate 10.

The trenches 37a penetrate through the p-type silicon carbide layer 72 in the depth direction Z from the front surface of the semiconductor substrate 10 (surface of the p-type silicon carbide layer 72) and reach the n$^-$-type silicon carbide layer 71. The trenches 37a, for example, may be disposed in a stripe shape extending along a direction parallel to the front surface of the semiconductor substrate 10 or may be disposed in a matrix-like layout as viewed from the front side of the semiconductor substrate 10. FIGS. 2 to 4 depict the trenches 37a having a stripe shape extending in a first direction X (refer to FIG. 1) along which the electrode pads 21b, 23a, 23b, 22 are arranged. Reference character Y is a direction that is parallel to the front surface of the semiconductor chip and orthogonal to the first direction.

In the trenches 37a, the gate electrodes 39a are provided via the gate insulating film 38a. The p-type base region 34a, the n$^+$-type source regions 35a, and the p$^{++}$-type contact regions 36a are selectively provided in surface regions of the front surface of the semiconductor substrate 10 between (mesa region) two of the trenches 37a that are adjacent to one another. The n$^+$-type source regions 35a and the p$^{++}$-type contact regions 36a are provided between the front surface of the semiconductor substrate 10 and the p-type base region 34a. The n$^+$-type source regions 35a are provided closer to the trenches 37a than are the p$^{++}$-type contact regions 36a.

The n$^+$-type source regions 35a are not disposed at an end portion of the main effective region 1a. The end portion of the main effective region 1a is a portion of the main effective region 1a further outward in a second direction Y than is an outermost trench 37a that is outermost among the trenches 37a and the end portion is a portion that is further outward in a first direction X than are ends of the trenches 37a. The p$^{++}$-type contact regions 36a may be omitted. When the p$^{++}$-type contact regions 36a are not provided, at a position further from the trenches 37a than are the n$^+$-type source regions 35a, the p-type base region 34a reaches the front surface of the semiconductor substrate 10 and is exposed at the front surface of the semiconductor substrate 10.

In the semiconductor substrate 10, at a position closer to an n$^+$-type drain region (the n$^+$-type starting substrate 31) than is the p-type base region 34a, the n$^-$-type drift region 32 is provided in contact with the p-type base region 34a. In contact with these regions, an n-type current spreading region 33a may be provided between the p-type base region 34a and the n$^-$-type drift region 32. The n-type current spreading region 33a is a so-called current spreading layer (CSL) that reduces carrier spreading resistance.

Further, in the semiconductor substrate 10, first and second p$^+$-type regions 61a, 62a may be provided at positions closer to the n$^+$-type drain region than is the p-type base region 34a. The first p$^+$-type regions 61a are provided to be separate from the p-type base region 34a and oppose bottoms of the trenches 37a in the depth direction Z. The first p$^+$-type regions 61a are partially connected to the second p$^+$-type regions 62a by portions not depicted.

The second p$^+$-type regions 62a are provided in mesa regions to be separate from the first p$^+$-type regions 61a and the trenches 37a, and are in contact with the p-type base region 34a. The first and second p$^+$-type regions 61a, 62a are fixed at the source electric potential of the main semiconductor element 11, via the p-type base region 34a. The first and second p$^+$-type regions 61a, 62a have a function of mitigating electric field applied to the bottoms of the trenches 37a.

An interlayer insulating film 40 is provided on the entire front surface of the semiconductor substrate 10 and covers the gate electrodes 39a. All of the gate electrodes 39a of the main semiconductor element 11 are electrically connected to the gate pad 21b (refer to FIG. 1) via a gate runner (not depicted), at a portion not depicted. The gate runner is a gate polysilicon layer that is provided on the front surface of the semiconductor substrate in the edge termination region 2 via a field insulating film 70 and that surrounds a periphery of the active region 1 in a substantially rectangular shape.

In first contact holes 40a that penetrate through the interlayer insulating film 40 in the depth direction Z and reach the semiconductor substrate 10, the n$^+$-type source regions 35a and the p$^{++}$-type contact regions 36a of the main semiconductor element 11 are exposed. In the first contact holes 40a, on the front surface of the semiconductor substrate 10, nickel silicide (NiSi, Ni$_2$Si, or thermally stable NiSi$_2$, hereinafter, collectively "NiSi") films 41a are provided.

The NiSi films 41a, in the first contact holes 40a, are in ohmic contact with the semiconductor substrate 10 and are electrically connected to the n$^+$-type source regions 35a and the p$^{++}$-type contact regions 36a. In a case where the p$^{++}$-type contact regions 36a are not provided, instead of the p$^{++}$-type contact regions 36a, the p-type base region 34a is exposed by the first contact holes 40a and is electrically connected to the NiSi films 41a.

In the main effective region 1a, on surfaces of the interlayer insulating film 40 and the NiSi films 41a overall, a barrier metal 46a is provided. The barrier metal 46a has a function of preventing interaction between metal films of the barrier metal 46a or between regions opposing and sandwiching the barrier metal 46a. The barrier metal 46a, for example, may have a stacked structure in which a first titanium nitride (TiN) film 42a, a first titanium (Ti) film 43a, a second TiN film 44a, and a second Ti film 45a are sequentially stacked.

The first TiN film 42a is provided only on a surface of the interlayer insulating film 40, covering the surface of the interlayer insulating film 40 overall. The first Ti film 43a is provided on surfaces of the first TiN film 42a and the NiSi films 41a. The second TiN film 44a is provided on a surface of the first Ti film 43a. The second Ti film 45a is provided on a surface of the second TiN film 44a. The barrier metal 46a, for example, is not provided in the temperature sensing portion 13.

The source pad 21a is embedded in the first contact holes 40a and provided on the entire surface of the second Ti film 45a. The source pad 21a is electrically connected to the $n^+$-type source regions 35a and the p-type base region 34a via the barrier metal 46a and the NiSi films 41a and functions as a source electrode of the main semiconductor element 11. The source pad 21a, for example, is an aluminum (Al) film or an aluminum alloy film having a thickness of about 5 μm.

In particular, when the source pad 21a is an aluminum alloy film, the source pad 21a, for example, may be an aluminum-silicon (Al—Si) film that contains at most about 5% in total, may be an aluminum-silicon-copper (Al—Si—Cu) film that contains at most about 5% silicon and at most about 5% copper (Cu) in total, or may be an aluminum-copper (Al—Cu) film that contains at most about 5% copper in total.

First ends of the terminal pins 48a are bonded on the source pad 21a, via plating films 47a and solder layers (not depicted). Second ends of the terminal pins 48a are bonded to a metal bar (not depicted) disposed so as to oppose the front surface of the semiconductor substrate 10. Further, the second ends of the terminal pins 48a are exposed outside a case (not depicted) in which the semiconductor substrate 10 is mounted and are electrically connected to an external device (not depicted). The terminal pins 48a are wiring members having a round bar-like (cylindrical) shape of a predetermined diameter.

The terminal pins 48a are soldered to the plating films 47a in a substantially upright state with respect to the front surface of the semiconductor substrate 10. The terminal pins 48a are external connection terminals that lead out electric potential of the source pad 21a to an external destination and are connected to an external ground potential (minimum electric potential). A portion of the surface of the source pad 21a other than portions having the plating films 47a is covered by a first protective film 49a, and borders between the plating films 47a and the first protective film 49a are covered by second protective films 50a. The first and the second protective films 49a, 50a, for example, are polyimide films.

A drain electrode 51 is in ohmic contact with an entire back surface (back surface of the $n^+$-type starting substrate 31) of the semiconductor substrate 10. On the drain electrode 51, for example, a drain pad (electrode pad: not depicted) is provided having a stacked structure in which a Ti film, a nickel (Ni) film, and a gold (Au) film are sequentially stacked. The drain pad is soldered to a metal base plate (not depicted) and at least a portion of the drain pad is in contact with a base part of a cooling fin (not depicted) via the metal base plate.

In this manner, the terminal pins 48a are bonded to the front surface of the semiconductor substrate 10 and the back surface is bonded to the metal base plate, whereby the semiconductor device 20 according to the first embodiment has a double-sided cooling structure in which a cooling structure is provided on both sides of the semiconductor substrate 10. In other words, heat generated by the semiconductor substrate 10 is radiated from a fin portion of the cooling fin in contact with the back surface of the semiconductor substrate 10 via the metal base plate and is radiated from the metal bar to which the terminal pins 48a of the front surface of the semiconductor substrate 10 are bonded.

The current sensing portion 12 includes the p-type base region 34b, $n^+$-type source regions 35b, $p^{++}$-type contact regions 36b, trenches 37b, a gate insulating film 38b, gate electrodes 39b, and the interlayer insulating film 40 respectively having configurations similar to configurations of corresponding parts of the main semiconductor element 11. Parts of the MOS gates of the current sensing portion 12 are provided in the sensing effective region 12a of the main non-operating region 1b. The p-type base region 34b of the current sensing portion 12 is configured by the p-type silicon carbide layer 72 similarly to the p-type base region 34a of the main semiconductor element 11.

In the current sensing portion 12 as well, similarly to the main semiconductor element 11, the $n^+$-type source regions 35b are not disposed at an end portion of the sensing effective region 12a. The end portion of the sensing effective region 12a is a portion of the sensing effective region 12a further outward in the second direction Y than is an outermost trench 37b that is outermost among the trenches 37b and the end portion is a portion that is further outward in the first direction X than are ends of the trenches 37b. In FIGS. 2 to 4, in the sensing effective region 12a, one unit cell of the current sensing portion 12 is depicted (similarly in FIG. 18). The $p^{++}$-type contact regions 36b may be omitted.

The current sensing portion 12, similarly to the main semiconductor element 11, may have an n-type current spreading region 33b and, first and second $p^+$-type regions 61b, 62b. The gate electrodes 39b of the current sensing portion 12 are electrically connected to the gate pad 21b (refer to FIG. 1) via a gate runner (not depicted). The gate electrodes 39b of the current sensing portion 12 are covered by the interlayer insulating film 40.

In the sensing effective region 12a, second contact holes 40b that penetrate through the interlayer insulating film 40 in the depth direction Z and reach the semiconductor substrate 10 are provided. In the second contact holes 40b, the $n^+$-type source regions 35b and the $p^{++}$-type contact regions 36b of the current sensing portion 12 are exposed. In the second contact holes 40b, similarly to the main semiconductor element 11, NiSi films 41b that are electrically connected to the $n^+$-type source regions 35b and the $p^{++}$-type contact regions 36b are provided.

In a case where the $p^{++}$-type contact regions 36b are not provided, instead of the $p^{++}$-type contact regions 36b, the p-type base region 34b is exposed by the second contact holes 40b and is electrically connected to the NiSi films 41b. In the sensing effective region 12a, similarly to the main semiconductor element 11, a barrier metal 46b is provided on an entire surface of the interlayer insulating film 40 and entire surfaces of the NiSi films 41b. Reference characters 42b to 45b are a first TiN film, a first Ti film, a second TiN film, and a second Ti film configuring the barrier metal 46b.

The OC pad 22 is provided on the entire surface of the barrier metal 46b so as to be embedded in the second contact holes 40b. The OC pad 22 is electrically connected to the n+-type source regions 35b and the p-type base region 34b of the current sensing portion 12, via the barrier metal 46b and the NiSi films 41b. The OC pad 22 functions as a source electrode of the current sensing portion 12. The OC pad 22, for example, is formed by a material similar to that of the source pad 21a.

In the sensing non-operating region 12b of the main non-operating region 1b, in a surface region of the front surface of the semiconductor substrate 10, as described above, the p-type low-dose region 63 is provided. The p-type low-dose region 63 is configured by a p−-type region 64 provided in a surface region of the semiconductor substrate 10 in the sensing non-operating region 12b. FIGS. 2 to 4 depict the p-type low-dose region 63 configured by the p−-type region 64 that reaches a position closer to an n+-type drain region than is the n-type current spreading region 33a of the main semiconductor element 11, from the front surface of the semiconductor substrate 10.

The p-type low-dose region 63, as described above, surrounds a periphery of the p-type base region 34b of the current sensing portion 12 via the n−-type region 32b, is separated from the p-type base region 34b of the current sensing portion 12 by the n−-type region 32b, and is separated from the p-type region for element separation by a non-depicted n−-type region. The n−-type region 32b, for example, is a diffusion region that penetrates the p-type silicon carbide layer 72 in the depth direction Z and reaches the n−-type silicon carbide layer 71, and is provided in a surface region of the front surface of the semiconductor substrate 10. Between the p-type low-dose region 63 and the front surface of the semiconductor substrate 10, the p++-type contact region 36c may be provided.

When the p-type low-dose region 63 is configured by plural p-type regions having differing p-type impurity concentrations, the p-type low-dose region 63, for example, may be configured by a p-type region 34a' and a p−-type region 64' that are adjacent to one another in the depth direction Z in a surface region of the front surface of the semiconductor substrate 10. The p-type region 34a', similarly to the p-type base region 34a of the main semiconductor element 11, is configured by the p-type silicon carbide layer 72 and is disposed in a surface region of the front surface of the semiconductor substrate 10. The p−-type region 64' is disposed between and is in contact with the p-type region 34a' and the n−-type drift region 32.

The p-type low-dose region 63 spans substantially an entire area of a region of the main non-operating region 1b excluding that directly beneath the OC pad 22. The p-type low-dose region 63 is connected to the p-type base region 34a of the main semiconductor element 11 between the main effective region 1a and the sensing effective region 12a, and is fixed at the source electric potential of the main semiconductor element 11. In a region of the main non-operating region 1b excluding the sensing effective region 12a and in the edge termination region 2, the field insulating film 70 is provided having a uniform thickness on the entire front surface of the semiconductor substrate 10.

In the sensing non-operating region 12b, the barrier metal 46b and the OC pad 22 extend on the field insulating film 70, from the sensing effective region 12a. In the sensing non-operating region 12b, the terminal pins 48b are bonded on the OC pad 22 by a wiring structure similar to a wiring structure on the source pad 21a. The terminal pins 48b on the OC pad 22 are wiring members having a round bar-like (cylindrical) shape of a diameter smaller than that of the terminal pins 48a on the source pad 21a.

Figure 5:
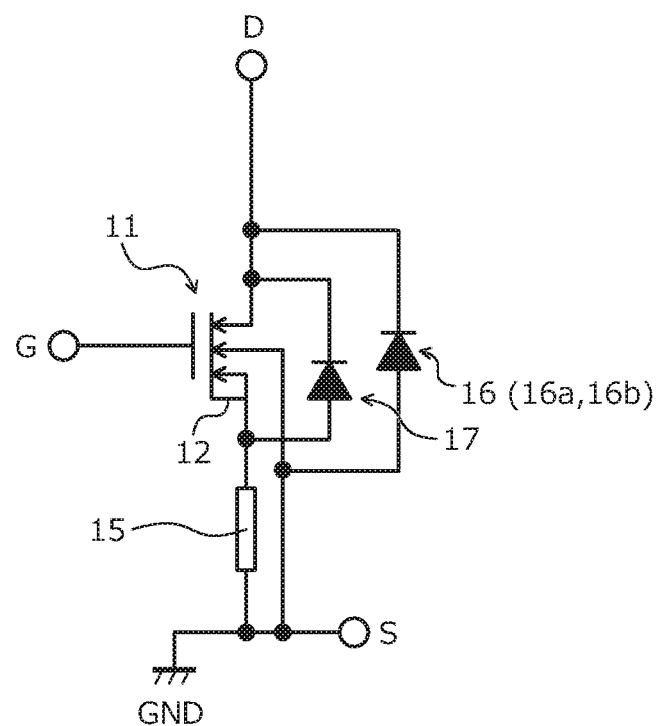
FIG. 5 is a circuit diagram depicting an equivalent circuit of the semiconductor device according to the first embodiment.

The terminal pins 48b, for example, are external connection terminals that lead out electric potential of the OC pad 22 and connect the OC pad 22 to a ground potential via an external resistor 15 (refer to FIG. 5). Disposal of the terminal pins 48b in the sensing non-operating region 12b enables pressure generated during bonding of the terminal pins 48b to be prevented from being applied to unit cells of the current sensing portion 12. Reference characters 47b, 49b, 50b are a plating film and first and second protective films that configure the wiring structure on the OC pad 22.

The field insulating film 70 and an n-type cathode region and a p-type anode region of the temperature sensing portion 13 are covered by the interlayer insulating film 40. The anode pad 23a and the cathode pad 23b are in contact with the p-type anode region and the n-type cathode region of the temperature sensing portion 13, respectively, in third and fourth contact holes (not depicted) of the interlayer insulating film 40. A material of the anode pad 23a and the cathode pad 23b, for example, is similar to that of the source pad 21a.

On the anode pad 23a and on the cathode pad 23b, terminal pins (not depicted) are bonded on each by wiring structures similar to the wiring structure on the source pad 21a. These terminal pins are external connection terminals that respectively lead electric potential of the anode pad 23a and the cathode pad 23b to an external destination, and are wiring members having a round bar-like shape of a predetermined diameter. Directly beneath the temperature sensing portion 13, the p-type low-dose region 63 described above extends in a surface region of the front surface of the semiconductor substrate 10.

The gate pad 21b is provided on the field insulating film 70. Between the gate pad 21b and the field insulating film 70, a barrier metal 46c having a stacked structure similar to that of the barrier metal 46a may be provided. Reference characters 42c to 45c are respectively a first TiN film, a first Ti film, a second TiN film, and a second Ti film that configure the barrier metal 46c. A material of the gate pad 21b, for example, may be similar to that of the source pad 21a.

On the gate pad 21b as well, for example, the terminal pins 48c are bonded by a wiring structure similar to the wiring structure on the source pad 21a. The terminal pins 48c are external connection terminals that lead electric potential of the gate pad 21b to an external destination and are wiring members having a round bar-like shape of a predetermined diameter. Reference characters 47c, 49c, 50c are a plating film and first and second protective films that configure the wiring structure on the gate pad 21b.

Directly beneath a gate pad portion 14 as well, similarly to directly beneath the temperature sensing portion 13, the p-type low-dose region 63 extends in a surface region of the front surface of the semiconductor substrate 10. The p-type low-dose region 63 may be connected to the p-type base region 34a of the main semiconductor element 11 by a region of the main non-operating region 1b excluding the sensing effective region 12a. The p++-type contact region 36c may be provided between the p-type low-dose region 63 and the front surface of the semiconductor substrate 10.

Operation of the semiconductor device 20 according to the first embodiment will be described. FIG. 5 is a circuit diagram depicting an equivalent circuit of the semiconductor device according to the first embodiment. As depicted in FIG. 5, the current sensing portion 12 is connected in parallel to plural MOSFET unit cells configuring the main semiconductor element 11. A ratio (hereinafter, current sensing ratio) of a sensing current flowing in the current sensing portion 12 and the main current flowing in the main semiconductor element 11 is preset.

The current sensing ratio, for example, may be set by changing the quantity of unit cells in the main semiconductor element 11 and in the current sensing portion 12. A sensing current that is smaller than the main current that flows in the main semiconductor element 11 flows in the current sensing portion 12, corresponding to the current sensing ratio. A source of the main semiconductor element 11 is connected to a grounding point GND of the ground potential. The resistor 15, which is an external component, is connected between the grounding point GND and a source of the current sensing portion 12.

In a state where voltage that is positive with respect to the source electrode of the main semiconductor element 11 (the source pad 21a) is applied to the drain electrode 51, when voltage that is at least equal to a threshold voltage is applied to the gate electrodes 39a of the main semiconductor element 11, an n-type inverse layer (channel) is formed in a portion of the p-type base region 34a of the main semiconductor element 11 sandwiched between the n$^+$-type source regions 35a and the n-type current spreading region 33a. As a result, the main current flows from the drain of the main semiconductor element 11 toward the source thereof and the main semiconductor element 11 turns ON.

Here, in a state in which voltage that is positive with respect to the source electrode (the OC pad 22) of the current sensing portion 12 is applied to the drain electrode 51 under conditions similar to those of the main semiconductor element 11, when voltage at least equal to the threshold voltage is applied to the gate electrodes 39b of the current sensing portion 12, an n-type inverse layer is formed in a portion of the p-type base region 34b of the sensing effective region 12a, the portion sandwiched between the n$^+$-type source regions 35b and the n-type current spreading region 33b. As a result, sensing current from the drain of the current sensing portion 12 toward the source thereof flows and the current sensing portion 12 turns ON.

The sensing current passes through the resistor 15 connected to the source of the current sensing portion 12 and flows to the grounding point GND. As a result, a voltage decrease occurs at the resistor 15. When overcurrent is applied to the main semiconductor element 11, the sensing current of the current sensing portion 12 increases according to the magnitude of the overcurrent to the main semiconductor element 11 and the voltage decrease at the resistor 15 also increases. The magnitude of the voltage decrease at the resistor 15 is monitored, thereby enabling detection of the overcurrent in the main semiconductor element 11.

On the other hand, when voltage less than the threshold voltage is applied to the gate electrodes 39a of the main semiconductor element 11, pn junctions between the first and the second p$^+$-type regions 61a, 62a, the n-type current spreading region 33a, and the n$^-$-type drift region 32 of the main semiconductor element 11 are reverse biased. The voltage that is less than the threshold voltage is further applied to the gate electrodes 39b of the current sensing portion 12; and pn junctions between the first and the second p$^+$-type regions 61b, 62b, the n-type current spreading region 33b, and the n$^-$-type drift region 32 of the current sensing portion 12 are also reverse biased. As a result, the main current of the main semiconductor element 11 and the sensing current of the current sensing portion 12 are blocked; and the main semiconductor element 11 and the current sensing portion 12 maintain the OFF state.

When the main semiconductor element 11 is OFF and voltage that is negative with respect to the source electrode of the main semiconductor element 11 is applied to the drain electrode 51, in the main effective region 1a of the active region 1, a parasitic diode 16a formed by pn junctions between the p-type base region 34a, the first and second p$^+$-type regions 61a, 62a, the n-type current spreading region 33a, and the n$^-$-type drift region 32 is energized. In a region of the main non-operating region 1b excluding the sensing effective region 12a, the parasitic diode 16b (refer to FIGS. 2 and 5) formed by the pn junction between the p-type low-dose region 63 and the n$^-$-type drift region 32 is energized. The parasitic diodes 16a, 16b are the parasitic diode 16 of the main semiconductor element 11.

In the edge termination region 2, a parasitic diode formed by a pn junction between the p-type region for element separation and the n$^-$-type drift region 32 is also energized. Further, when the current sensing portion 12 is OFF and voltage that is negative with respect to the source electrode of the current sensing portion 12 is applied to the drain electrode 51, in the sensing effective region 12a of the main non-operating region 1b of the active region 1, the parasitic diode 17 formed by the pn junctions between the p-type base region 34b, the first and the second p$^+$-type regions 61b, 62b, the n-type current spreading region 33b, and the n$^-$-type drift region 32 is energized. As described above, a periphery of the sensing effective region 12a is surrounded by the p-type low-dose region 63 and therefore, a periphery of the parasitic diode 17 of the current sensing portion 12 is surrounded by the parasitic diode 16b of the main non-operating region 1b.

As described above, the total dose of the p-type low-dose region 63 is lower than the total dose of the p-type region of the front side of the semiconductor substrate 10 in the main effective region 1a. Therefore, when the parasitic diode 16b of the main non-operating region 1b is energized, an inflow amount of holes supplied from the p-type low-dose region 63 to the n$^-$-type drift region 32 is lower than an inflow amount of holes supplied from a p-type region that forms the parasitic diode 16a to the n$^-$-type drift region 32 when the parasitic diode 16a of the main effective region 1a is energized. As a result, when the main semiconductor element 11 and the current sensing portion 12 are OFF, an amount of holes that accumulate in the n$^-$-type drift region 32 may be suppressed near the sensing effective region 12a.

Accordingly, when the main semiconductor element 11 and the current sensing portion 12 switch from OFF to ON and the parasitic diodes 16a, 16b, 17 turn OFF, in a region of the main non-operating region 1b excluding the sensing effective region 12a, an amount of positive hole current (reverse recovery current of the parasitic diode 16b of the main non-operating region 1b) generated by the n$^-$-type drift region 32 may be made to be smaller than an amount of positive hole current (reverse recovery current of the parasitic diode 16a of the main effective region 1a) generated by the n$^-$-type drift region 32 of the main effective region 1a. Therefore, the positive hole current may be suppressed from passing through the p-type base region 34b of the current sensing portion 12 and excessively flowing to the OC pad 22.

A method of manufacturing the semiconductor device 20 according to the first embodiment will be described. FIGS. 6, 7, 8, 9, 10, and 11 are cross-sectional views of the semiconductor device according to the first embodiment during manufacture. In FIGS. 6 to 11, while only the main semiconductor element 11 is depicted, each part of all elements fabricated (manufactured) on the semiconductor substrate 10 having the main semiconductor element 11, for example, are formed concurrently with each part of the main semiconductor element 11. Formation of each part of the current sensing portion 12, the temperature sensing portion 13, and the gate pad portion 14 will be described with reference to FIGS. 1 to 4.

Figure 6:
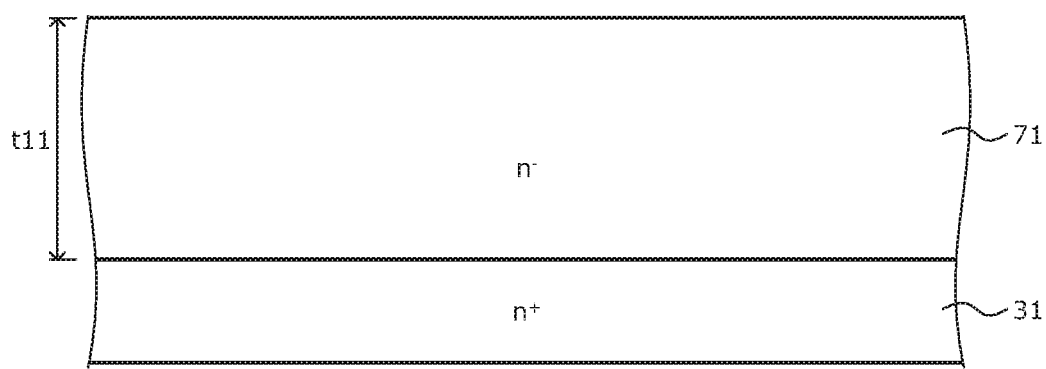
FIG. 6 is a cross-sectional view of the semiconductor device according to the first embodiment during manufacture.

First, as depicted in FIG. 6, the n$^+$-type starting substrate (semiconductor wafer) 31 containing silicon carbide is prepared. The n$^+$-type starting substrate 31, for example, may be a silicon carbide single crystal substrate doped with nitrogen (N). Next, on a front surface of the n$^+$-type starting substrate 31, the n$^-$-type silicon carbide layer 71 doped with a lower concentration of nitrogen than is the n$^+$-type starting substrate 31 is formed by epitaxial growth. When the main semiconductor element 11 has a breakdown voltage of 3300V, a thickness t11 of the n$^-$-type silicon carbide layer 71, for example, may be about 30 μm.

Figure 7:
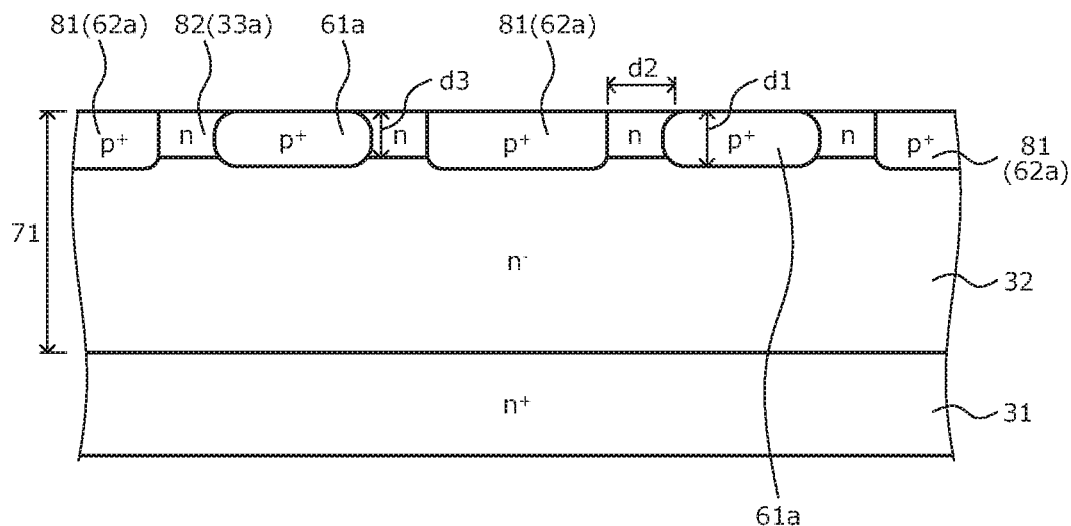
FIG. 7 is a cross-sectional view of the semiconductor device according to the first embodiment during manufacture.

Next, as depicted in FIG. 7, by photolithography and, for example, ion implantation of a p-type impurity such as Al, the first p$^+$-type regions 61a and p$^+$-type regions 81 are selectively formed in surface regions of the n$^-$-type silicon carbide layer 71 in the main effective region 1a. The p$^+$-type regions 81 are a part of the second p$^+$-type regions 62a. The first p$^+$-type regions 61a and the p$^+$-type regions 81, for example, are disposed to repeatedly alternate one another along the first direction X depicted in FIG. 1.

A distance d2 between one of the first p$^+$-type regions 61a and one of the p$^+$-type regions 81 adjacent to one another, for example, may be about 1.5 μm. A depth d1 and an impurity concentration of the first p$^+$-type regions 61a and the p$^+$-type regions 81, for example, may be about 0.5 μm and about 5.0×10$^{18}$/cm$^3$, respectively. Subsequently, an ion implantation mask (not depicted) used in forming the first p$^+$-type regions 61a and the p$^+$-type regions 81 is removed.

Next, by photolithography and, for example, ion implantation of an n-type impurity such as nitrogen, n-type regions 82 are formed in surface regions of the n$^-$-type silicon carbide layer 71, spanning the main effective region 1a overall. The n-type regions 82, for example, are formed between the first p$^+$-type regions 61a and the p$^+$-type regions 81, to be in contact with these regions. A depth d3 and an impurity concentration of the n-type regions 82, for example, may be about 0.4 μm and about 1.0×10$^{17}$/cm$^3$, respectively.

The n-type regions 82 are a part of the n-type current spreading region 33a. A portion of the n$^-$-type silicon carbide layer 71 sandwiched between the n-type regions 82, the first p$^+$-type regions 61a, the p$^+$-type regions 81, and the n$^+$-type starting substrate 31 is the n$^-$-type drift region 32. Next, an ion implantation mask (not depicted) used in forming the n-type regions 82 is removed. A sequence in which the n-type regions 82, the first p$^+$-type regions 61a, and the p$^+$-type regions 81 are formed may be interchanged.

Figure 8:
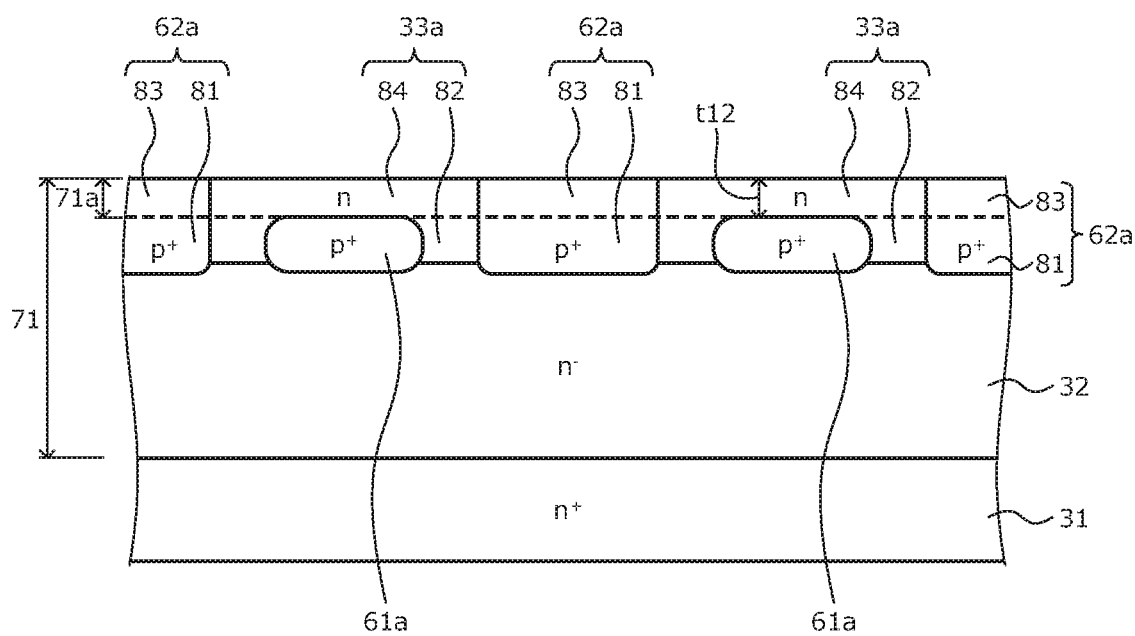
FIG. 8 is a cross-sectional view of the semiconductor device according to the first embodiment during manufacture.

Next, as depicted in FIG. 8, on the n$^-$-type silicon carbide layer 71, for example, an n$^-$-type silicon carbide layer doped with an n-type impurity such as nitrogen is further formed, for example, to have a thickness t12 of 0.5 μm, thereby increasing the thickness of the n$^-$-type silicon carbide layer 71.

Next, by photolithography and ion implantation of a p-type impurity such as Al, in a portion 71a increasing the thickness of the n$^-$-type silicon carbide layer 71, p$^+$-type regions 83 are selectively provided to a depth reaching the p$^+$-type regions 81. The p$^+$-type regions 81, 83 that are adjacent to one another in the depth direction Z are connected and form the second p$^+$-type regions 62a. A width and an impurity concentration of the p$^+$-type regions 83, for example, are substantially equal to those of the p$^+$-type regions 81. Next, an ion implantation mask used in forming the p$^+$-type regions 83 (not depicted) is removed.

Next, by photolithography and, for example, ion implantation of an n-type impurity such as nitrogen, in the portion 71a increasing the thickness of the n$^-$-type silicon carbide layer 71, n-type regions 84 are selectively formed to a depth reaching the n-type regions 82. An impurity concentration of the n-type regions 84, for example, is substantially equal to that of the n-type regions 82. The n-type regions 82, 84 that are adjacent to one another in the depth direction Z are connected, whereby the n-type current spreading region 33a is formed. A sequence in which the p$^+$-type regions 83 and the n-type regions 84 are formed may be interchanged. Next, an ion implantation mask (not depicted) used in forming the n-type regions 84 is removed.

Figure 9:
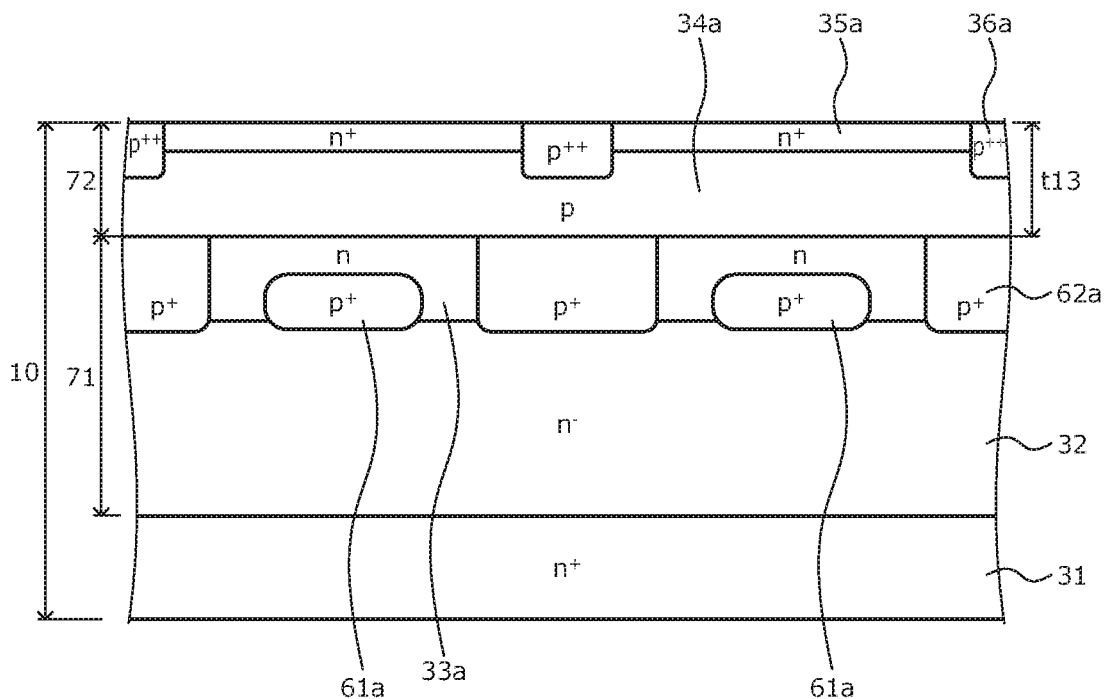
FIG. 9 is a cross-sectional view of the semiconductor device according to the first embodiment during manufacture.

Next, as depicted in FIG. 9, on the n$^-$-type silicon carbide layer 71, for example, the p-type silicon carbide layer 72 doped with a p-type impurity such as Al is formed by epitaxial growth. A thickness t13 and an impurity concentration of the p-type silicon carbide layer 72, for example, may be about 1.3 μm and about 4.0×10$^{17}$/cm$^3$, respectively. As a result, the semiconductor substrate (semiconductor wafer) 10 in which the n$^-$-type silicon carbide layer 71 and the p-type silicon carbide layer 72 are sequentially stacked on the n$^+$-type starting substrate 31 by epitaxial growth is formed.

Next, a process including photolithography, ion implantation, and removal of the ion implantation mask as one set is repeatedly performed under different conditions, thereby selectively forming in the p-type silicon carbide layer 72 in the main effective region 1a, the n$^+$-type source regions 35a and the p$^{++}$-type contact regions 36a of the main semiconductor element 11.

A sequence in which the n$^+$-type source regions 35a and the p$^{++}$-type contact regions 36a are formed may be interchanged. In the main effective region 1a, a portion sandwiched by the n$^+$-type source regions 35a, the p$^{++}$-type contact regions 36a, and the n$^-$-type silicon carbide layer 71 is the p-type base region 34a. In the ion implantations described above, for example, a resist film or an oxide film may be used as an ion implantation mask.

Next, with respect to diffusion regions (the first and the second p$^+$-type regions 61a, 62a, the n-type current spreading region 33a, the n$^+$-type source regions 35a, and the p$^{++}$-type contact regions 36a) formed by ion implantation, for example, a heat treatment (activation annealing) for impurity activation is performed at a temperature of about 1700 degrees C. for about 2 minutes. The activation annealing may be performed once for all of the diffusion regions collectively after formation or may be performed each ion implantation for forming the diffusion regions.

Figure 10:
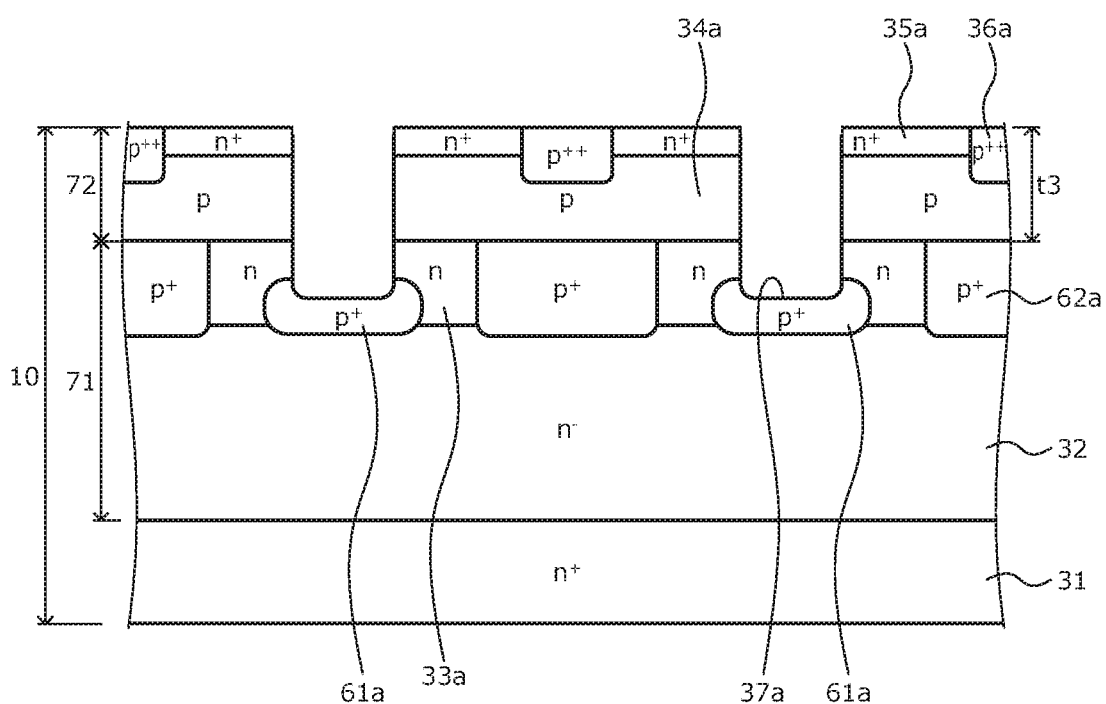
FIG. 10 is a cross-sectional view of the semiconductor device according to the first embodiment during manufacture.

Next, as depicted in FIG. 10, by photolithography and, for example, dry etching, the trenches 37a that penetrate through the n$^+$-type source regions 35a and the p-type base region 34a are formed. The trenches 37a, for example, have a depth reaching the first p$^+$-type regions 61a in the n-type current spreading region 33a. As an etching mask for forming the trenches 37a, for example, a resist mask or an oxide mask may be used. Subsequently, the etching mask is removed.

Figure 11:
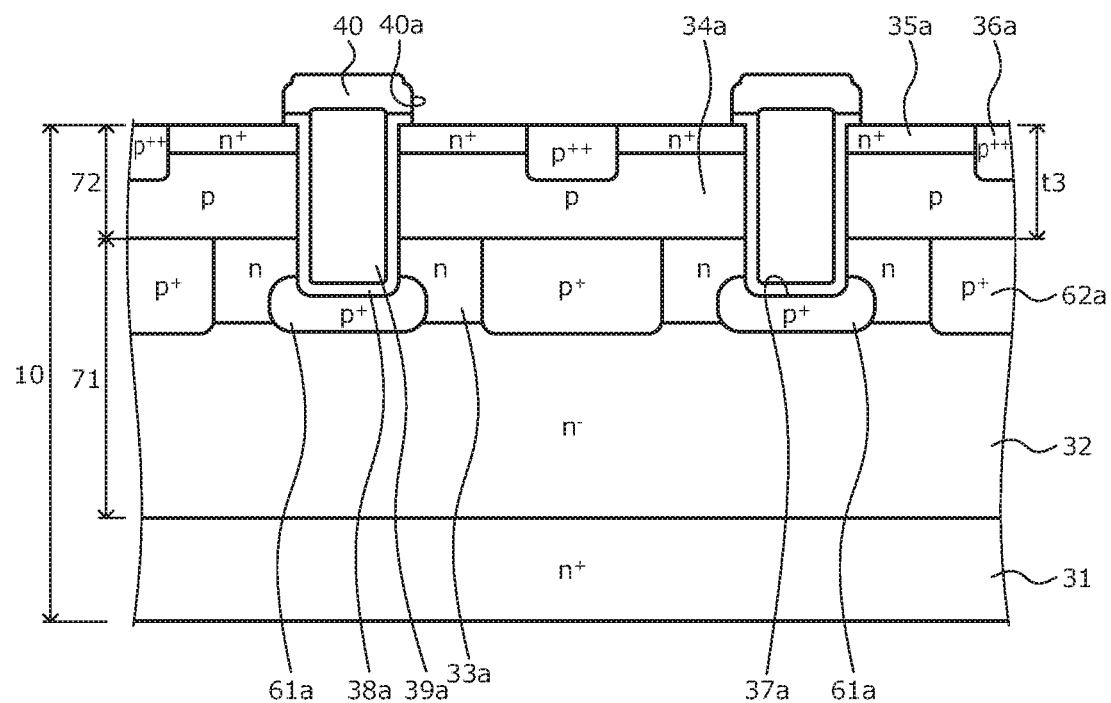
FIG. 11 is a cross-sectional view of the semiconductor device according to the first embodiment during manufacture.

Next, as depicted in FIG. 11, the gate insulating film 38a is formed along the surface of the semiconductor substrate 10 and inner walls of the trenches 37a. The gate insulating film 38a, for example, may be a thermal oxide film formed by a temperature of about 1000 degrees C. in an oxygen (O$_2$) atmosphere, or a deposited film of a high temperature oxide (HTO). Next, in the trenches 37a, on the gate insulating film 38a, for example, a polysilicon layer doped with phosphorus is formed as the gate electrodes 39a.

All elements (for example, the current sensing portion 12, for example, a diffusion diode forming the temperature sensing portion 13 and the over-voltage protecting portion, a complementary MOS (CMOS) configuring the arithmetic circuit portion) other than the main semiconductor element 11, suffice to be formed in the main non-operating region 1b of the semiconductor substrate 10, concurrently with the corresponding parts of the main semiconductor element 11 when the parts of the main semiconductor element 11 described above are formed.

For example, diffusion regions of elements disposed on the semiconductor substrate 10 suffice to be formed concurrently with diffusion regions having the same conductivity type, impurity concentration and diffusion depth among the diffusion regions configuring the main semiconductor element 11. Further, gate trenches, gate insulating films, and gate electrodes of elements disposed on the semiconductor substrate 10 suffice to be formed concurrently with the trenches 37a, the gate insulating film 38a, and the gate electrodes 39a of the main semiconductor element 11, respectively.

The p-type low-dose region 63 may be configured by at least one of the p-type base region 34a of the main semiconductor element 11 and the first and second $p^+$-type regions 61a, 62a. Further, when the p-type low-dose region 63 is formed concurrently with the p-type base region 34a and/or the first and second $p^+$-type regions 61a, 62a by multistage (multiple sessions of) ion implantation, the number of stages (sessions) of the ion implantation to a formation region of the p-type low-dose region 63 may be reduced to control the total dose of the p-type low-dose region 63.

Further, the p-type low-dose region 63 may be formed by a new ion implantation different from the ion implantation for forming the p-type base region 34a of the main semiconductor element 11 and the first and second $p^+$-type regions 61a, 62a. Moreover, in the main non-operating region 1b, in a surface region of the front surface of the semiconductor substrate 10, the $n^-$-type region 32b is formed; and the p-type low-dose region 63 and the sensing effective region 12a are separated from one another by the $n^-$-type region 32b.

Next, on the front surface of the semiconductor substrate 10, the field insulating film 70 is formed. The field insulating film 70 may be formed before the gate insulating film 38a. Next, by a general method, the gate runner (not depicted) is formed on the field insulating film 70. When the temperature sensing portion 13 is a polysilicon diode, for example, formation thereof on the field insulating film 70 may concurrent with the gate runner.

Next, on the front surface of the semiconductor substrate 10 overall, the interlayer insulating film 40 is formed. The interlayer insulating film 40, for example, may be a phosphosilicate glass (PSG). A thickness of the interlayer insulating film 40, for example, may be about 1 μm. Next, by photolithography and etching, the interlayer insulating film 40 and the gate insulating films 38a, 38b are selectively removed, forming the first and the second contact holes 40a, 40b.

Here, the first contact holes 40a exposing the $n^+$-type source regions 35a and the $p^{++}$-type contact regions 36a of the main semiconductor element 11 are formed. The second contact holes 40b exposing the $n^+$-type source regions 35b and the $p^{++}$-type contact regions 36b of the current sensing portion 12 are formed in the sensing effective region 12a. Next, by a heat treatment, the interlayer insulating film 40 is planarized (reflow).

Next, for example, by sputtering, the first TiN films 42a, 42b are formed on the front surface of the semiconductor substrate 10 overall. The first TiN films 42a, 42b cover the entire surfaces of the interlayer insulating film 40 and portions (the $n^+$-type source regions 35a, 35b and the $p^{++}$-type contact regions 36a, 36b) of the front surface of the semiconductor substrate 10 exposed by the first and the second contact holes 40a, 40b.

Next, by photolithography and etching, portions of the first TiN films 42a, 42b covering the semiconductor substrate 10 in the first and the second contact holes 40a, 40b are removed, again exposing the $n^+$-type source regions 35a, 35b and the $p^{++}$-type contact regions 36a, 36b. As a result, the first TiN films 42a, 42b are left as the barrier metals 46a, 46b on the entire surface of the interlayer insulating film 40.

Next, for example, by sputtering, on semiconductor portions (the front surface of the semiconductor substrate 10) exposed by the first and the second contact holes 40a, 40b, a Ni film (not depicted) is formed. Here, the Ni film is further formed on the first TiN films 42a, 42b. Next, for example, by a heat treatment of about 970 degrees C., a silicide is formed where the Ni film is in contact with the semiconductor portions, thereby forming the NiSi films 41a, 41b that are in ohmic contact with the semiconductor portions.

During the heat treatment for converting this nickel into a silicide, the first TiN films 42a, 42b are disposed between the interlayer insulating film 40 and the Ni film, whereby diffusion of nickel atoms in the nickel film into the interlayer insulating film 40 may be prevented. A portion of the Ni film on the interlayer insulating film 40 is not in contact with a semiconductor portion and therefore, is not converted into a silicide. Thereafter, the portion of the Ni film on the interlayer insulating film 40 is removed, exposing the interlayer insulating film 40.

Next, on the back surface of the semiconductor substrate 10, for example, a Ni film is formed. Next, for example, by a heat treatment of about 970 degrees C., the Ni film is converted into a silicide, thereby forming as the drain electrode 51, a NiSi film in ohmic contact with a semiconductor portion (back surface of the semiconductor substrate 10). The heat treatment for silicide conversion when the NiSi film that becomes the drain electrode 51 is formed may be performed concurrently with the heat treatment for forming the NiSi films 41a, 41b of the front surface of the semiconductor substrate 10.

Next, by sputtering, on the front surface of the semiconductor substrate 10, the first Ti films 43a, 43b, the second TiN films 44a, 44b, and the second Ti films 45a, 45b forming the barrier metals 46a, 46b; and an Al film (or an aluminum alloy film) forming the source pad 21a, the gate pad 21b, and the OC pad 22 are sequentially stacked. A thickness of the Al film, for example, is at most about 5 μm.

Next, by photolithography and etching, a metal film deposited on the front surface of the semiconductor substrate 10 is patterned, leaving portions becoming the barrier metals 46a, 46b, the source pad 21a, the gate pad 21b, the OC pad 22, the OV pad (not depicted) of the over-voltage protecting portion, and the electrode pad (not depicted) of the arithmetic circuit portion.

The anode pad 23a and the cathode pad 23b of the temperature sensing portion 13 may be formed concurrently with the source pad 21a, or may be formed at a timing different from that of the source pad 21a. Next, for example, by sputtering, on a surface of the drain electrode 51, for example, a Ti film, an Ni film, and a gold (Au) film are sequentially stacked, thereby forming the drain pad (not depicted).

Next, for example, the front surface of the semiconductor substrate 10 is protected by a polyimide film by a chemical vapor deposition (CVD) method. Next, by photolithography and etching, the polyimide film is selectively removed, thereby forming and opening the first protective films 49a to 49c that cover electrode pads respectively.

Next, after a general plating pretreatment, the plating films 47a to 47c are formed by a general plating process in portions of the electrode pads 21a, 21b, 22, 23a, 23b exposed in the openings of the first protective films 49a to 49c. Here, the first protective films 49a to 49c function as masks that suppress wet spreading of the plating films 47a to 47c. A thickness of the plating films 47a to 47c, for example, may be about 5 μm.

Next, for example, by a CVD method, a polyimide film becoming the second protective films 50a to 50c that cover each of the borders between the plating films 47a to 47c and the first protective films 49a to 49c is formed. Next, the terminal pins 48a to 48c are bonded on the plating films 47a to 47c by respective solder layers (not depicted). Here, the second protective films 50a to 50c function as masks that suppress wet spreading of the solder layers.

Thereafter, the semiconductor substrate 10 is diced (cut) into individual chips, whereby the semiconductor device 20 depicted in FIGS. 1 to 3 is completed.

As described above, according to the first embodiment, in a surface region of the front surface of the semiconductor substrate in the main non-operating region, the p-type low-dose region that surrounds a periphery of the sensing effective region is disposed to be separate from the sensing effective region. The p-type low-dose region is fixed at the source electric potential of the main semiconductor element and has a total dose that is lower than that of the p-type regions at the front side of the semiconductor substrate in the main effective region. In other words, between the main semiconductor element (the main effective region) and the current sensing portion (the sensing effective region), the p-type low-dose region that is at the source electric potential of the main semiconductor element and has a resistance that is higher than that of the p-type regions at the front side of the semiconductor substrate in the main effective region is provided.

Therefore, according to the first embodiment, when the main semiconductor element and the current sensing portion concurrently switch from OFF to ON and the parasitic diodes of the main semiconductor element and the current sensing portion concurrently turn OFF, the positive hole current generated in the main effective region does not easily flow into the p-type low-dose region having a high resistance and the positive hole current may be suppressed from passing through the p-type base region of the current sensing portion and excessively flowing to the OC pad. As a result, electric field applied to the current sensing portion may be mitigated, whereby ESD capability of the current sensing portion increases and the reverse recovery resistance of the parasitic diode of the main non-operating region may be increased.

Further, according to the first embodiment, in the main non-operating region, in substantially an entire area of a surface region of the front surface of the semiconductor substrate, the p-type low-dose region is disposed, whereby in the main non-operating region, electric field at the front surface of the semiconductor substrate becomes uniform and the breakdown voltage may be enhanced.

Therefore, in the main non-operating region, local concentration of the electric field at the field insulating film may be suppressed and dielectric breakdown of the field insulating film may be suppressed.

Figure 12:
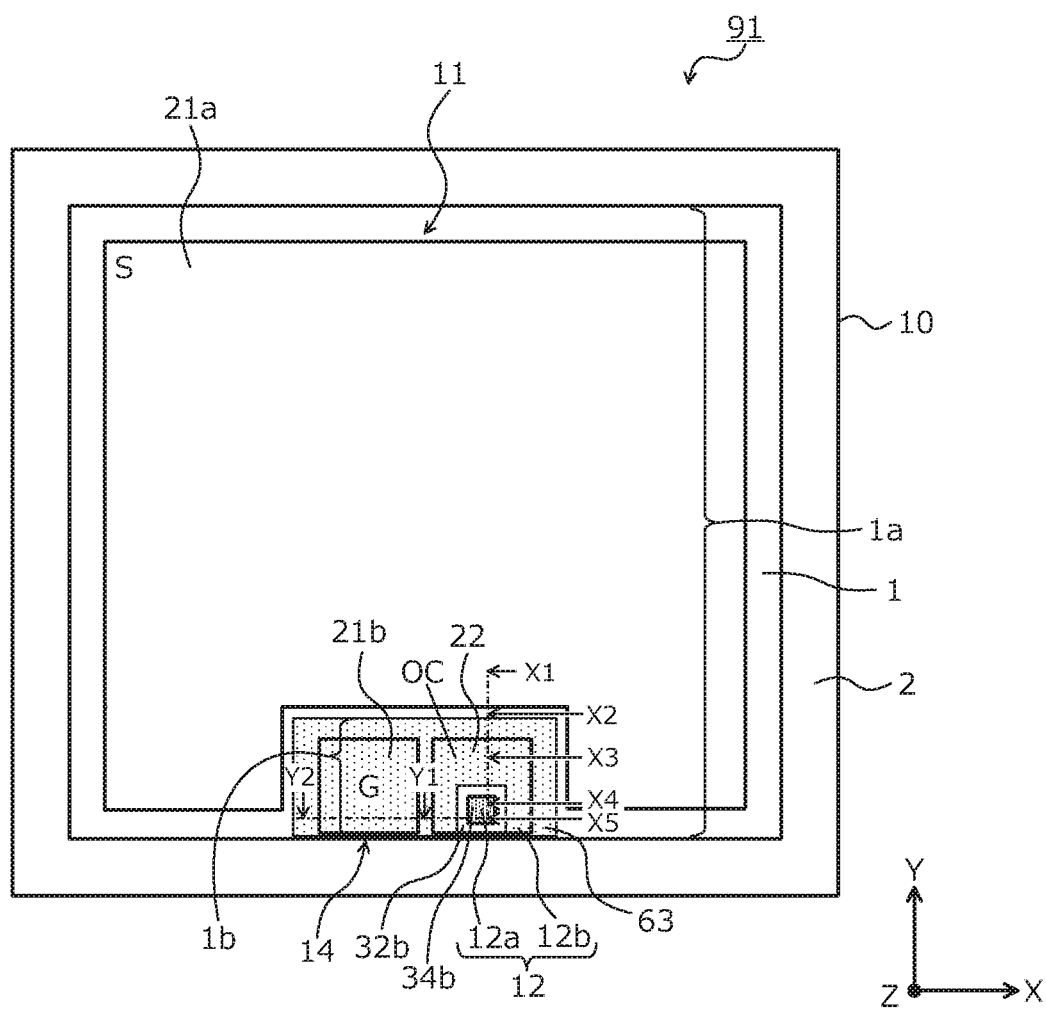
FIG. 12 is a plan view of a layout when a semiconductor device according to a second embodiment is viewed from the front side of the semiconductor substrate.

A semiconductor device according to a second embodiment will be described. FIG. 12 is a plan view of a layout when the semiconductor device according to the second embodiment is viewed from the front side of the semiconductor substrate. A semiconductor device 91 according to the second embodiment differs from the semiconductor device 20 according to the first embodiment (refer to FIGS. 1 to 4) in that in the active region 1 of the single semiconductor substrate 10, the main semiconductor element 11 and the current sensing portion 12 alone are provided.

In other words, in the second embodiment, in the main non-operating region 1b, only the gate pad 21b and the OC pad 22 are disposed. Therefore, on the semiconductor substrate 10 having the main semiconductor element 11, the surface area of the main non-operating region 1b is smaller as compared to a case in which the current sensing portion 12 and a high-function portion other than the current sensing portion 12 are disposed as circuit portions for protecting/controlling the main semiconductor element 11.

In the main non-operating region 1b, similarly to the first embodiment, the p-type low-dose region 63 that surrounds a periphery of the sensing effective region 12a in a substantially rectangular shape is disposed to be separate from the sensing effective region 12a. In this manner, the number of electrode pads disposed in the main non-operating region 1b is relatively fewer, whereby even when the surface area of the main non-operating region 1b relatively smaller, provision of the p-type low-dose region 63 enables effects similar to those of the first embodiment to be obtained.

The extent to which the surface area of the main non-operating region 1b is reduced, the surface area of the main effective region 1a increases, thereby enabling current capability of the semiconductor device 91 according to the second embodiment to be enhanced. In the second embodiment, for example, the main effective region 1a may have a substantially rectangular planar shape in which a portion is recessed inward. The main non-operating region 1b may be disposed at the recessed portion of the main effective region 1a and may have a substantially rectangular planar shape surrounded on three sides by the main effective region 1a.

In the second embodiment, a cross-sectional view of the structure (cross-sectional view of the structure along cutting line X1-X2-X3-X4-X5) of the main effective region 1a and the current sensing portion 12 is similar to that of the first embodiment (refer to FIG. 2 or 4). A cross-sectional view of the structure (cross-sectional view of the structure along cutting line X1-X2, cutting line X4-X5, and cutting line Y1-Y2) of the main effective region 1a, the sensing effective region 12a, and the temperature sensing portion 13 is similar to that of the first embodiment (refer to FIG. 3).

As described above, according to the second embodiment, even when only the main semiconductor element and the current sensing portion are provided in the active region of a single semiconductor substrate, effects similar to those of the first embodiment may be obtained.

Figure 13:
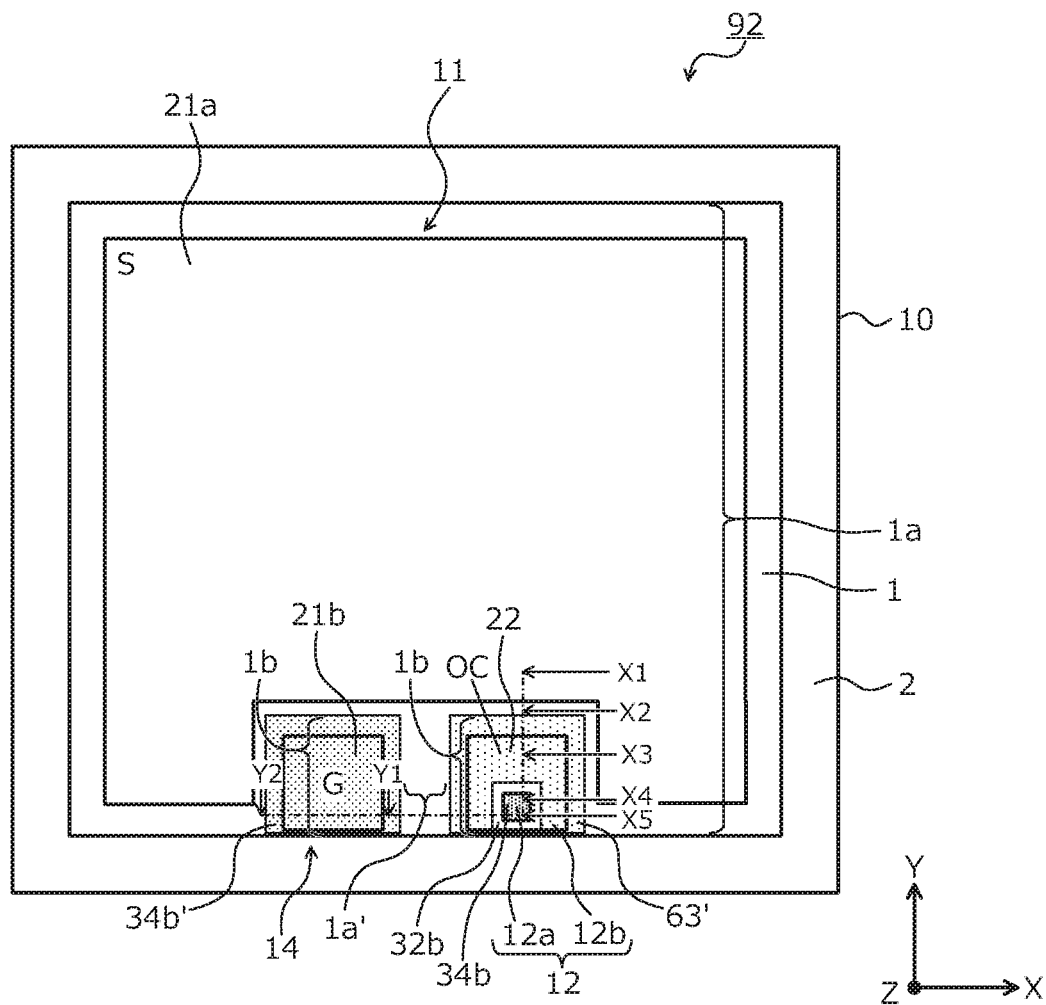
FIG. 13 is a plan view of a layout when a semiconductor device according to a third embodiment is viewed from the front side of the semiconductor substrate.

A semiconductor device according to a third embodiment will be described. FIG. 13 is a plan view of a layout when the semiconductor device according to the third embodiment is viewed from the front side of the semiconductor substrate. A semiconductor device 92 according to the third embodiment differs from the semiconductor device 91 according to the second embodiment (refer to FIG. 12) in that only directly beneath the OC pad 22, a p-type low-dose region 63' is provided. Directly beneath the gate pad 21b, the p-type base region 34b' is provided to be separate from the p-type low-dose region 63'.

The p-type low-dose region 63' has a surface area that is larger than that of the OC pad 22 and faces an entire surface of the OC pad 22 in the depth direction Z. The p-type low-dose region 63', similarly to the first embodiment, between the main effective region 1a and the main non-operating region 1b, is connected to the p-type base region 34a of the main semiconductor element 11 and is fixed at the source electric potential of the main semiconductor element 11. The p-type low-dose region 63', similarly to the first embodiment, surrounds a periphery of the sensing effective region 12a in a substantially rectangular shape and is separate from the sensing effective region 12a.

The p-type base region 34b' has a surface area that is larger than that of the gate pad 21b and faces an entire surface of the gate pad 21b in the depth direction Z. The p-type base region 34b' has an impurity concentration that is equal to that of the p-type base region 34a of the main semiconductor element 11; the p-type base region 34b' is connected to the p-type base region 34a of the main semiconductor element 11 and is fixed at the source electric potential of the main semiconductor element 11. Between the p-type base region 34b' and the n$^-$-type drift region 32, a second p$^+$-type region may be disposed similarly to the main semiconductor element 11.

In a region between the p-type base region 34b' and the p-type low-dose region 63', a unit cell of the main semiconductor element 11 may be disposed as a main effective region 1a'. In this case, when a parasitic diode formed by pn junctions between the p-type base region 34b', a second p$^+$-type region, and the n$^-$-type drift region 32 turns OFF, positive hole current generated by the n$^-$-type drift region 32 directly beneath the gate pad 21b is lead out from the p-type base region 34a of the main effective region 1a' to the source pad 21a.

The third embodiment may be applied to the semiconductor device 20 according to the first embodiment (FIGS. 1 to 4). In other words, on the semiconductor substrate 10 having the main semiconductor element 11, when a high-function portion other than the current sensing portion 12 is disposed together with the current sensing portion 12 as a circuit portion for protecting/controlling the main semiconductor element 11, configuration may be such that the p-type low-dose region 63' is provided only directly beneath the OC pad 22 while the p-type base region 34b' is provided to be separate from and directly beneath electrode pads other than the source pad 21a and the OC pad 22.

As described, according to the third embodiment, even when a p-type base region is provided directly beneath an electrode pad other than the OC pad, and the p-type low-dose region is provided only directly beneath the OC pad so as to surround a periphery of the sensing effective region 12a, effects similar to those of the first and the second embodiments may be obtained.

Figure 14:
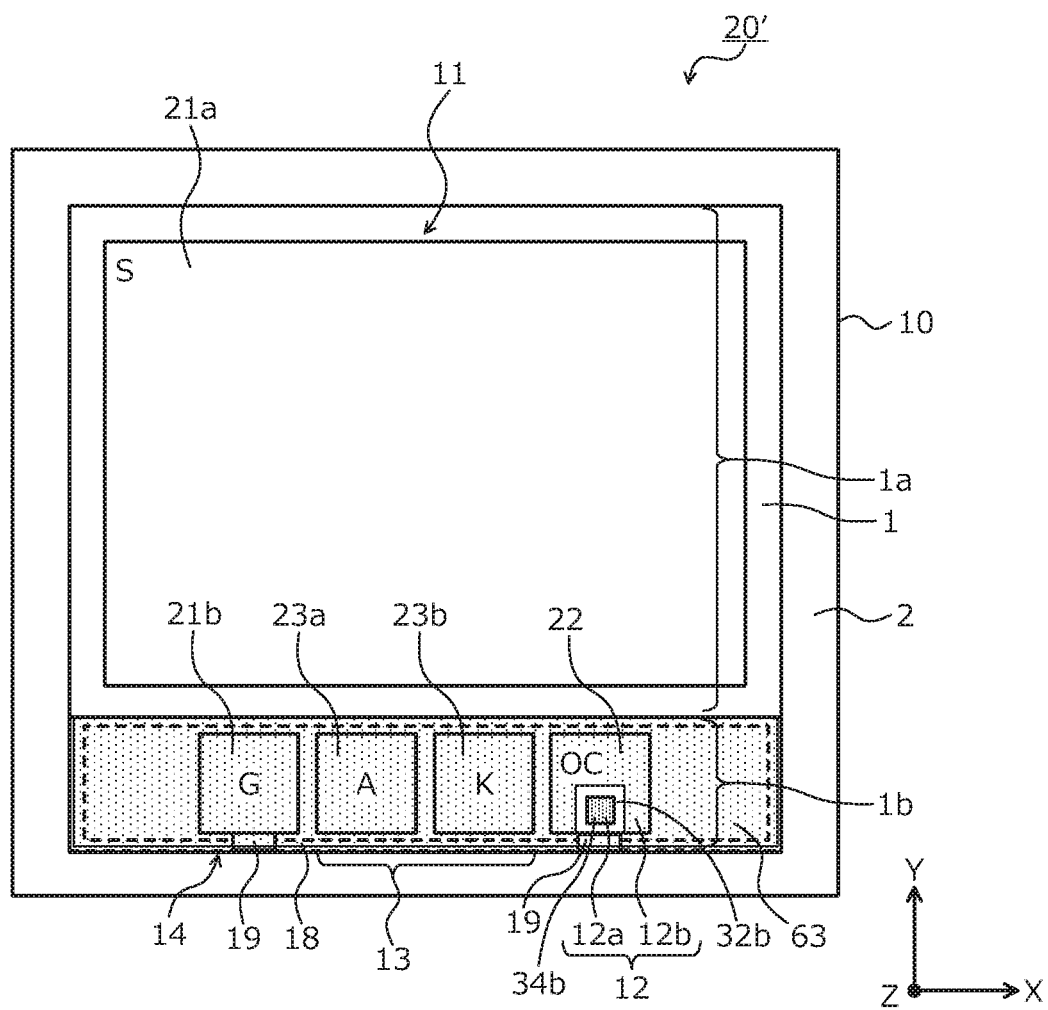
FIG. 14 is a plan view of a layout when a semiconductor device according to a fourth embodiment is viewed from the front side of the semiconductor substrate.

A semiconductor device according to a fourth embodiment will be described. FIG. 14 is a plan view of a layout when the semiconductor device according to the fourth embodiment is viewed from the front side of the semiconductor substrate. A semiconductor device 20' according to the fourth embodiment differs from the semiconductor device 20 according to the first embodiment (refer to FIGS. 1 to 4) in that the semiconductor device 20' includes a metal electrode (hereinafter, lead-out electrode) 18 that leads positive hole current generated by the n$^-$-type drift region 32 near the main non-operating region 1b to a grounding point GND of a ground potential.

The lead-out electrode 18, in the main non-operating region 1b, is provided on the front surface of the semiconductor substrate 10 and is electrically connected to the p-type low-dose region 63. The lead-out electrode 18 is fixed at the electric potential (the source electric potential: the ground potential) of the source pad 21a. The lead-out electrode 18, for example, in an outer peripheral portion of the main non-operating region 1b, is provided along a border between the main non-operating region 1b and the edge termination region 2. The lead-out electrode 18, in contact holes of a non-depicted interlayer insulating film, is electrically connected to the p-type low-dose region 63 via p$^{++}$-type contact regions 19.

The p$^{++}$-type contact regions 19 are provided in surface regions of the semiconductor substrate 10, in the p-type low-dose region 63. In FIG. 14, while a case is depicted in which the p$^{++}$-type contact regions 19 are respectively formed between the gate pad 21b and the edge termination region 2, and between the OC pad 22 and the edge termination region 2, the p$^{++}$-type contact region 19 suffices to be disposed between either thereof. Further, the p$^{++}$-type contact regions 19 may be disposed between the anode pad 23a and the edge termination region 2, and between the cathode pad 23b and the edge termination region 2.

The lead-out electrode 18, when the parasitic diodes 16, 17 (refer to FIG. 5) of the active region 1 turn OFF, has a function of leading positive hole current that is generated by the n$^-$-type drift region 32 of the main effective region 1a and the edge termination region 2 and that flows into the main non-operating region 1b, to the grounding point GND of the ground potential via the p-type low-dose region 63 and the p$^{++}$-type contact regions 19. In FIG. 14, an inner periphery of the lead-out electrode 18 is indicated by a dashed line. An outer periphery of the lead-out electrode 18 is the same as an outer periphery of the main non-operating region 1b.

Figure 15:
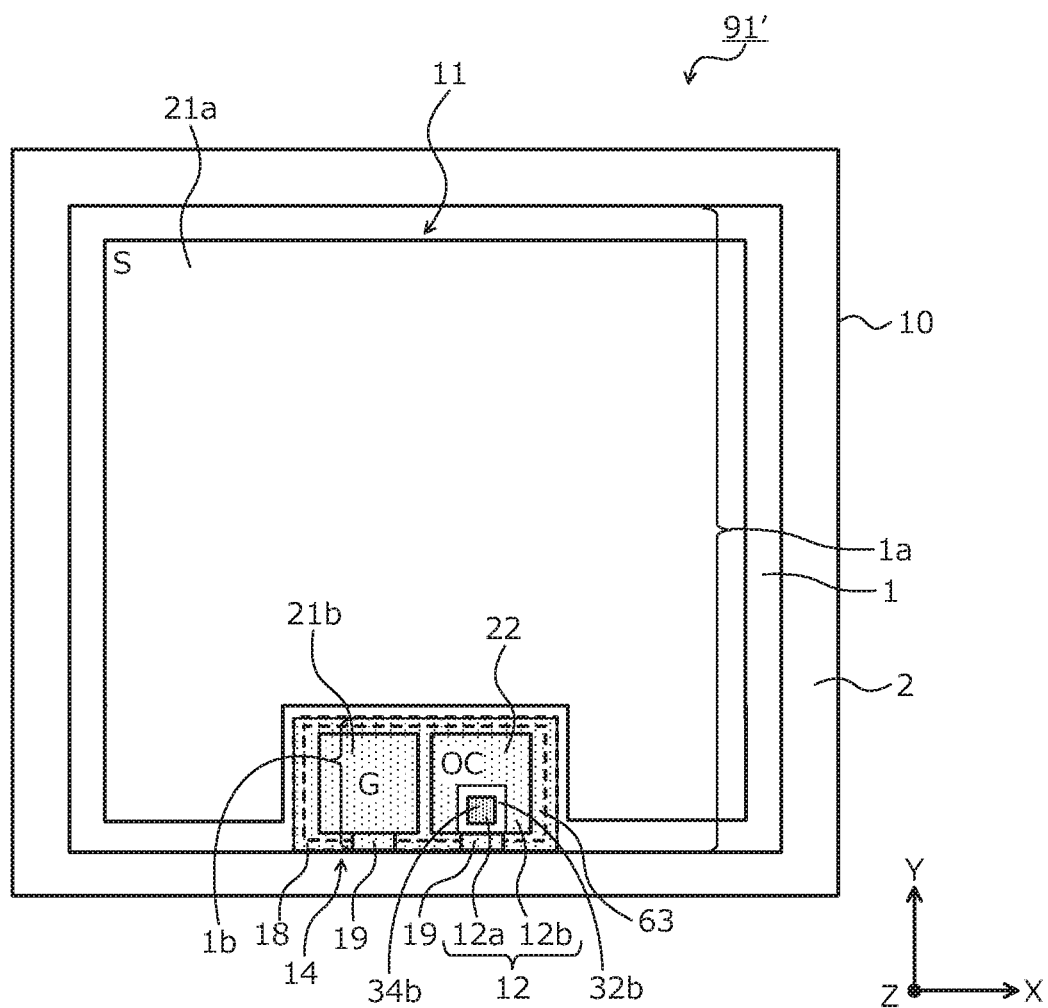
FIG. 15 is a plan view of another example of the layout when the semiconductor device according to the fourth embodiment is viewed from the front side of the semiconductor substrate.
Figure 16:
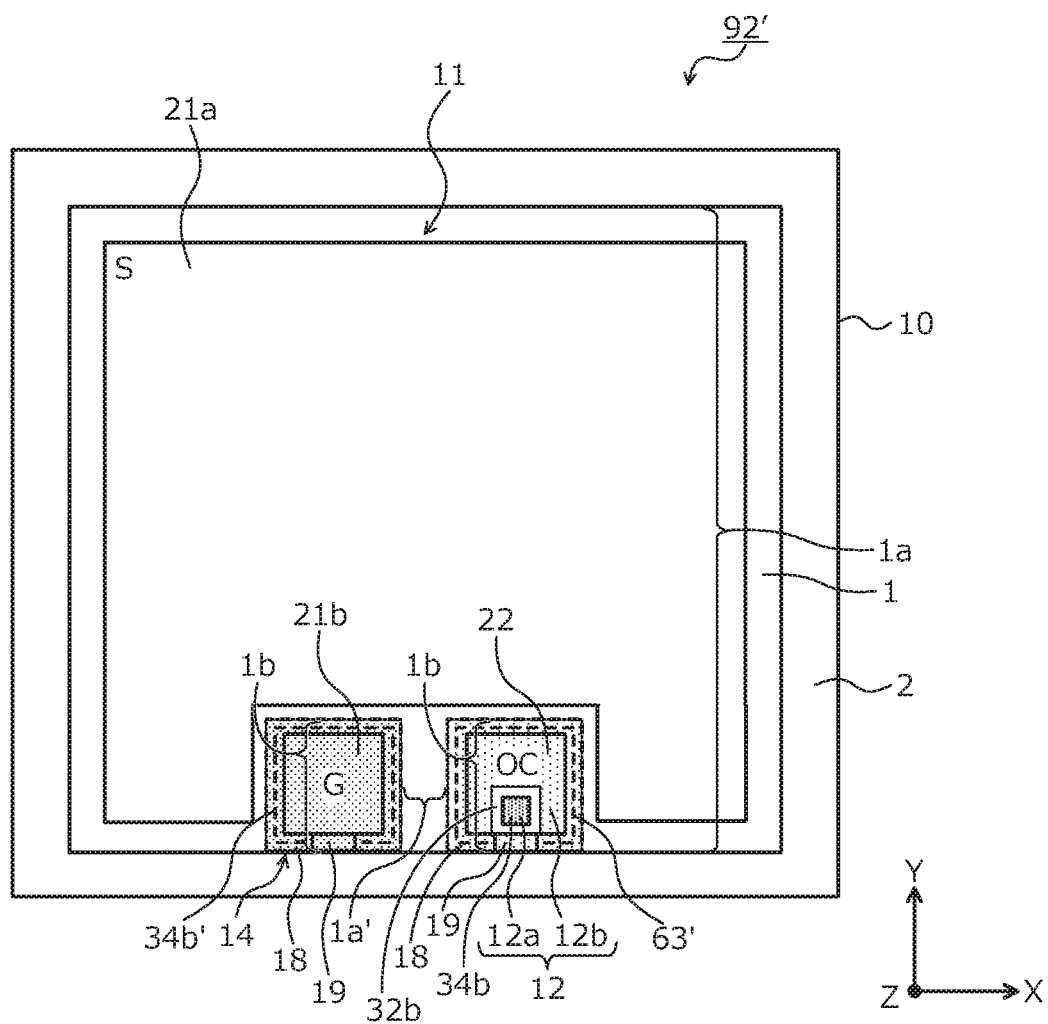
FIG. 16 is a plan view of another example of the layout when the semiconductor device according to the fourth embodiment is viewed from the front side of the semiconductor substrate.

FIGS. 15 and 16 are plan views of other examples of the layout when the semiconductor device according to the fourth embodiment is viewed from the front side of the semiconductor substrate. The fourth embodiment may be applied to the semiconductor devices 91, 92 (FIGS. 12 and 13) according to the second and the third embodiments and as depicted in FIGS. 15 and 16, in semiconductor devices 91', 92' having only the main semiconductor element 11 and the current sensing portion 12 in the active region 1 of the single semiconductor substrate 10, the lead-out electrode 18 that is electrically connected to the p-type low-dose regions 63, 63' may be disposed.

As described above, according to the fourth embodiment, effects similar to those of the first to the third embodiments may be obtained. Further, according to the fourth embodiment, in the main non-operating region, the lead-out electrode that is electrically connected to the p-type low-dose region that is fixed at the source electric potential is provided, whereby when the parasitic diode of the active region turns OFF, positive hole current that flows into the main non-operating region is lead out from the lead-out electrode, thereby further enabling the reverse recovery resistance of the parasitic diode in the main non-operating region to be enhanced.

Figure 17:
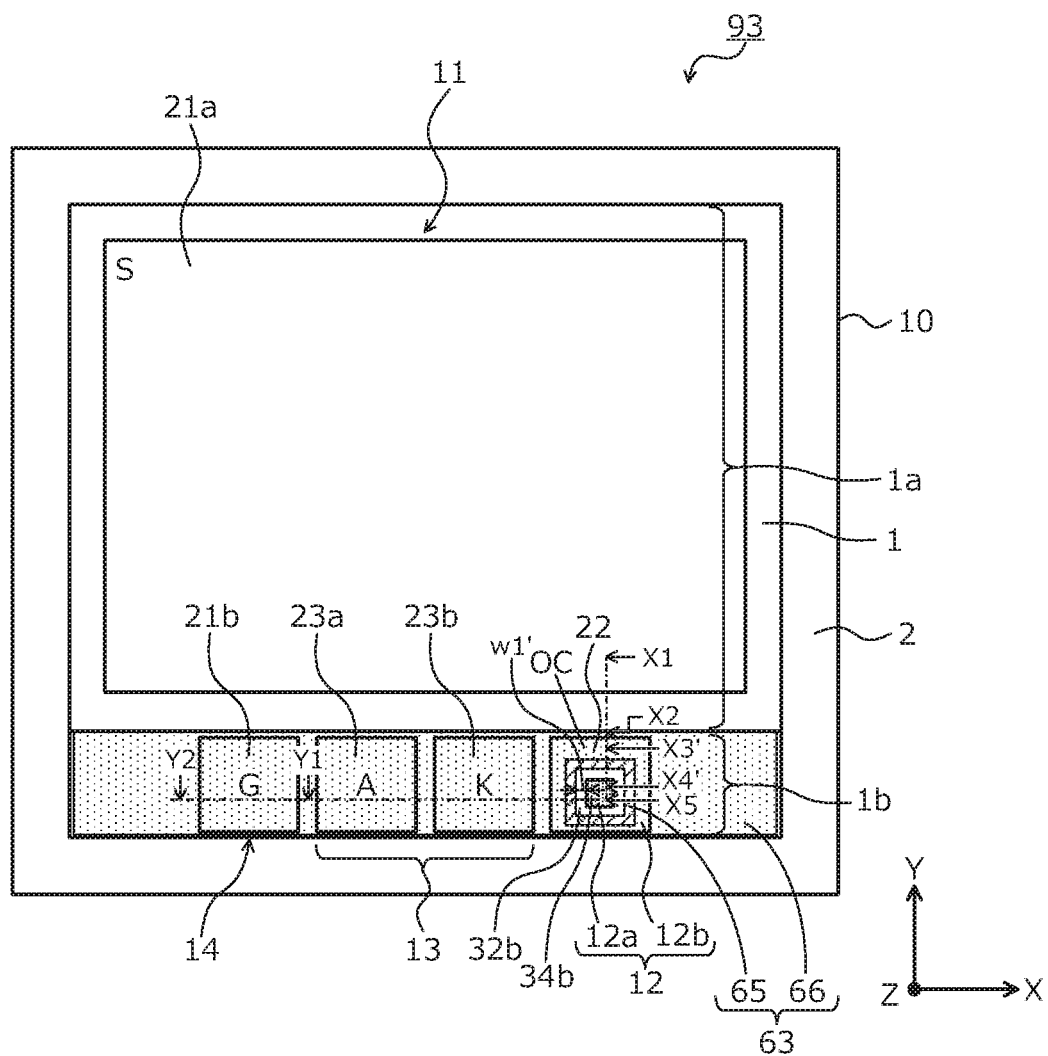
FIG. 17 is a plan view of a layout when a semiconductor device according to a fifth embodiment is viewed from the front side of the semiconductor substrate.

A semiconductor device according to a fifth embodiment will be described. FIG. 17 is a plan view of a layout when the semiconductor device according to the fifth embodiment is viewed from the front side of the semiconductor substrate.

FIG. 18 is a cross-sectional view of a structure of the active region in FIG. 17. In FIG. 18, a cross-sectional view of the structure (cross-sectional view of the structure along cutting line X1-X2-X3'-X4'-X5) of the main effective region 1a and the current sensing portion 12 is depicted. A cross-section of the structure along cutting line X1-X2 and cutting line X4'-X5 in FIG. 18 is similar to the cross-section of the structure along cutting line X1-X2 and cutting line X4-X5 in FIG. 2.

A semiconductor device 93 according to the fifth embodiment differs from the semiconductor device 20 according to the first embodiment (refer to FIGS. 1 to 4) in that the p-type low-dose region 63 is configured by two p-type regions (hereinafter, first and second p-type low-dose regions (fifth and sixth second-conductivity-type regions)) 65, 66 that have differing p-type impurity concentrations and that are concentric with respect to the sensing non-operating region 12b, and surround a periphery of the sensing non-operating region 12b. The first p-type low-dose region 65 is provided in a surface region of the front surface of the semiconductor substrate 10, in the sensing non-operating region 12b of the main non-operating region 1b.

The first p-type low-dose region 65 is in contact with the $n^-$-type region 32b that surrounds a periphery of the sensing effective region 12a in a substantially rectangular shape and the first p-type low-dose region 65 surrounds a periphery of the p-type base region 34b of the current sensing portion 12 in a substantially rectangular shape, via the $n^-$-type region 32b. The $n^-$-type region 32b separates the first p-type low-dose region 65 and the p-type base region 34b of the current sensing portion 12. The first p-type low-dose region 65 may be configured by one p-type region or may be configured by plural p-type regions of differing p-type impurity concentrations disposed adjacent to one another in the depth direction Z like the p-type low-dose region 63 in FIG. 4.

The first p-type low-dose region 65 is fixed at the source electric potential of the main semiconductor element 11, via the second p-type low-dose region 66. A total dose of the first p-type low-dose region 65 is lower than a total dose of the second p-type low-dose region 66. In other words, only the first p-type low-dose region 65 of the p-type low-dose region 63 has a total dose that is lower than that of the p-type region of the front side of the semiconductor substrate 10 in the main effective region 1a. Conditions of the total dose of the first p-type low-dose region 65 may be similar to those of the p-type low-dose region 63 of the first embodiment (refer to FIGS. 1 to 4).

In this manner, even when only the total dose of the first p-type low-dose region 65 that is a part of the p-type low-dose region 63 closer the sensing effective region 12a is reduced, similarly to the first embodiment, the reverse recovery resistance of the parasitic diode 17 of the main non-operating region 1b may be increased. A distance w1' between the first p-type low-dose region 65 and the p-type base region 34b of the sensing effective region 12a is equal to the distance w1 between the p-type low-dose region 63 and the p-type base region 34b of the sensing effective region 12a of the first embodiment (refer to FIG. 1).

Provided that only the total dose of the first p-type low-dose region 65 of the p-type low-dose region 63 is set to the conditions described above, the total dose of the second p-type low-dose region 66 that is a part further from the sensing effective region 12a than is the first p-type low-dose region 65 may be variously changed. Therefore, the degree of freedom of the design of the second p-type low-dose region 66 increases. For example, the total dose of the second p-type low-dose region 66 may be set higher than that of the p-type low-dose region 63 of the first embodiment, or the forward voltage of the parasitic diode 16b (refer to FIGS. 2 and 5) may be increased.

The second p-type low-dose region 66, directly beneath the OC pad 22, is disposed adjacent to the first p-type low-dose region 65 and surrounds a periphery of the first p-type low-dose region 65 in a substantially rectangular shape. Further, the second p-type low-dose region 66 spans substantially an entire area of the main non-operating region 1b directly beneath the OC pad 22. The second p-type low-dose region 66, similarly to the p-type low-dose region 63 of the first embodiment, is connected to the p-type base region 34a of the main semiconductor element 11 and is separated from the p-type region for element separation by a non-depicted $n^-$-type region.

The second p-type low-dose region 66 is connected to the p-type base region 34a of the main semiconductor element 11, whereby the first and the second p-type low-dose regions 65, 66 are fixed at the source electric potential of the main semiconductor element 11. The total dose of the second p-type low-dose region 66 may be variously changed. The second p-type low-dose region 66 may be configured by one p-type region or may be configured by plural p-type regions adjacent to one another in the depth direction Z and having differing p-type impurity concentrations like the p-type low-dose region 63 of FIG. 4.

In the main non-operating region 1b, a ratio of a surface area of the first p-type low-dose region 65 and a surface area of the second p-type low-dose region 66 may be variously changed. For example, the ratio of the surface area of the first p-type low-dose region 65 to the surface area of the second p-type low-dose region 66 may be determined by a tradeoff relationship between reverse recovery resistance and forward voltage of the parasitic diode 16 of the main semiconductor element 11b formed in the main non-operating region 1b, or by a tradeoff relationship between reverse recovery resistance and forward voltage of the parasitic diode 17 of the current sensing portion 12.

The fifth embodiment may be applied to the semiconductor devices 91, 92 (FIGS. 12 and 13) according to the second and the third embodiments, and the p-type low-dose region 63 directly beneath the gate pad 21b and the OC pad 22 of the semiconductor device having only the main semiconductor element 11 and the current sensing portion 12 in the active region 1 of the single semiconductor substrate 10, may be configured by the first and the second p-type low-dose regions 65, 66. The fourth embodiment (FIG. 14) may be applied to the semiconductor device 93 according to the fifth embodiment and the lead-out electrode 18 may also be disposed.

As described above, according to the fifth embodiment, even when only the portion (first p-type low-dose region) of the p-type low-dose region, the portion surrounding a periphery of the sensing effective region via the $n^-$-type region is set to have a total dose that is lower than that of the p-type region of the front side of the semiconductor substrate in the main effective region, effects similar to those of the first to the fourth embodiments may be obtained.

A semiconductor device according to a sixth embodiment will be described. FIG. 19 is a cross-sectional view of a configuration of the semiconductor device according to the sixth embodiment. A layout when the semiconductor device according to the sixth embodiment is viewed from the front side of the semiconductor substrate is similar to that of the first embodiment (FIG. 1). In FIG. 19, while a cross-sectional view of a structure directly beneath the anode pad 23a and the cathode pad 23b of the temperature sensing portion 13 is omitted, a cross-section of the structure directly beneath the anode pad 23a and the cathode pad 23b is similar to that directly beneath the gate pad 21b. While the sensing effective region 12a is not depicted, a cross-section of the structure of the current sensing portion 12 is similar to that of the first embodiment (refer to FIG. 2).

A semiconductor device 94 according to the sixth embodiment differs from the semiconductor device 20 according to the first embodiment (refer to FIGS. 1 to 4) in that the p-type low-dose region 63 is disposed only directly beneath the OC pad 22 and a unit cell of the main semiconductor element 11 is disposed directly beneath a portion of the main non-operating region 1b other than the OC pad 22. The sixth embodiment may be applied to the semiconductor devices 91, 92, 20', 91', 92', 93 (FIGS. 12 to 17) according to the second to the fifth embodiments and a unit cell of the main semiconductor element 11 may be disposed directly beneath a portion of the main non-operating region 1b other than directly beneath the OC pad 22.

Figure 20:
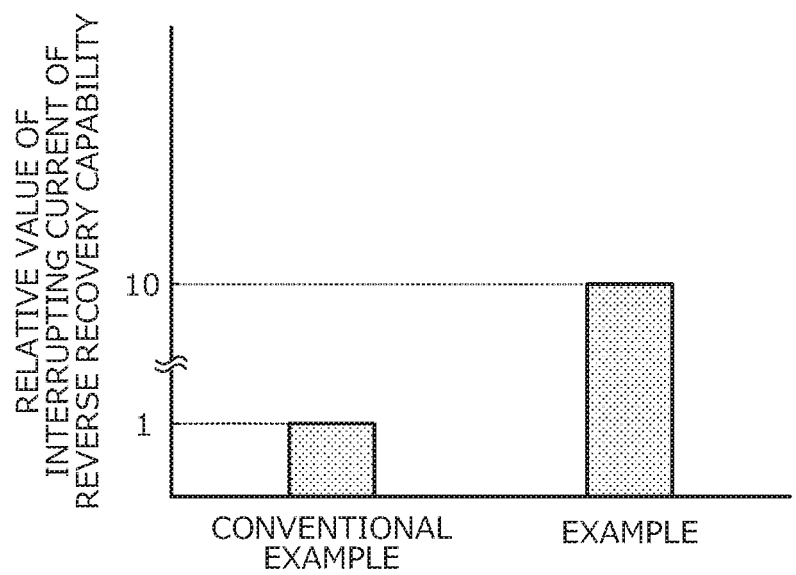
FIG. 20 is a characteristics diagram of amounts of interrupting current due to reverse recovery capability of an example.
Figure 21:
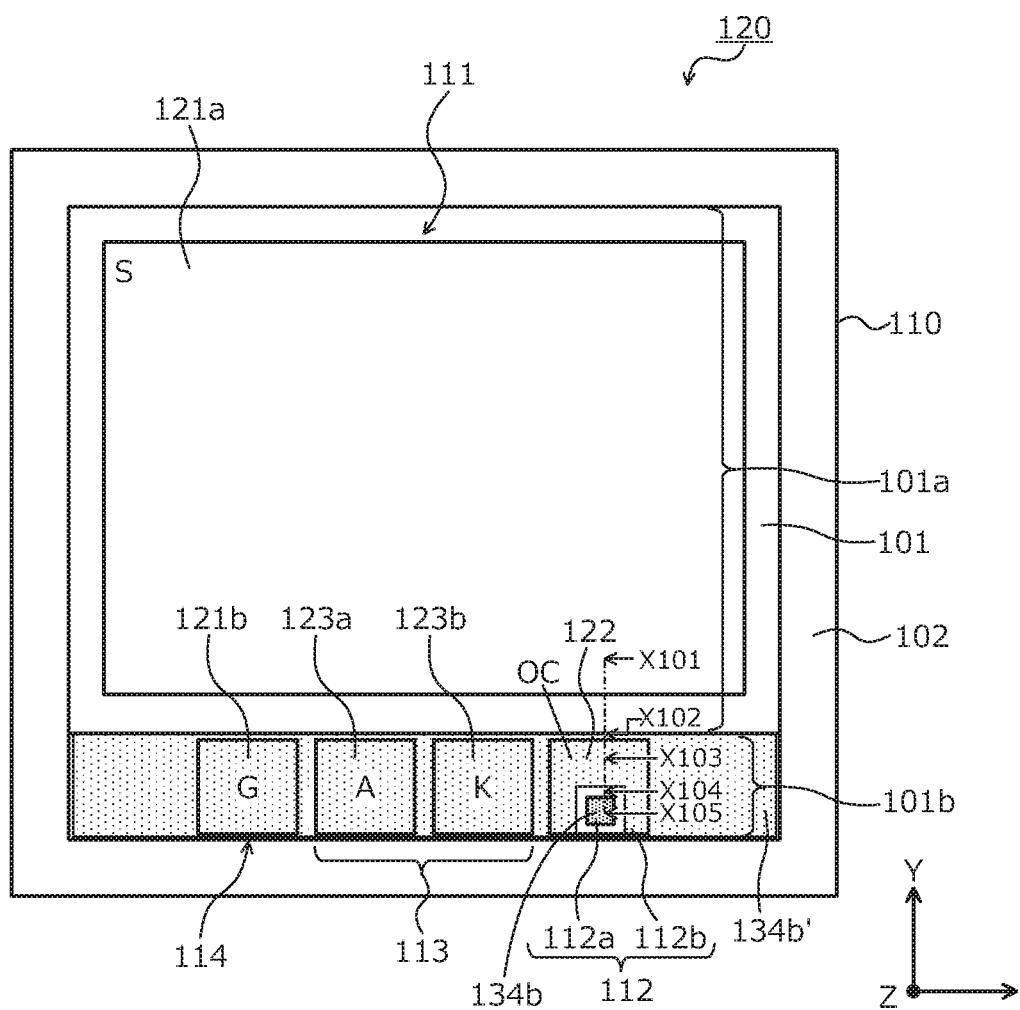
FIG. 21 is a plan view of a layout when a conventional semiconductor device is viewed from a front side of a semiconductor substrate.

Reverse recovery resistance of the semiconductor device 20 according to the first embodiment was verified. FIG. 20 is a characteristics diagram of amounts of interrupting current due to reverse recovery capability of an example. FIG. 20 depicts results of comparison of the amount of positive hole current (interrupting current) that passes through the p-type base region of the main effective region and is lead out to the source pad when a parasitic diode of the active region turns OFF, in the semiconductor device 20 according to the first embodiment described above (hereinafter, example, refer to FIG. 1) and the conventional semiconductor device 120 (hereinafter, conventional example, refer to FIG. 21).

As depicted in FIG. 20, in the example, when the parasitic diodes 16, 17 (refer to FIG. 5) of the active region 1 turn OFF, the amount of positive hole current that passes through the p-type base region 34a of the main effective region 1a and that is lead out to the source pad 21a was confirmed to be greater as compared to the conventional example. In the example, between the main effective region 1a and the sensing effective region 12a, the p-type low-dose region 63 that surrounds a periphery of the sensing effective region 12a has a higher resistance than that of the p-type region of the front side of the semiconductor substrate 10 in the main effective region 1a. As a result, the positive hole current generated by the main effective region 1a does not easily pass through the p-type low-dose region 63 and flow into the sensing effective region 12a, and the reverse recovery resistance of the parasitic diode 17 of the main non-operating region 1b is enhanced.

While not depicted, the inventor confirmed that effects similar to those of the example are also obtained in the semiconductor devices 91, 92, 20', 91', 92', 93 according to the second to the sixth embodiments.

In the foregoing, in the present invention, without limitation to the described embodiments, various modifications within a range not departing from the spirit of the invention are possible. For example, in the active region, arrangement of the main non-operating region may be variously changed; and the main non-operating region may be disposed near a center of the active region and a periphery thereof may be surrounded by the main effective region. Further, for example, instead of a trench gate structure, a planar gate structure may be provided. Further, the present invention is further applicable when instead of using silicon carbide as a semiconductor material, a wide bandgap semiconductor other than silicon carbide is used as a semiconductor material. Further, the present invention is similarly implemented when the conductivity types (n-type, p-type) are reversed.

The semiconductor device according to the present invention achieves an effect in that in a semiconductor device that includes a current sensing portion on a semiconductor substrate having a main semiconductor element, reverse recovery resistance of a parasitic diode may be enhanced.

As described above, the semiconductor device according to the present invention is useful for semiconductor devices that include a current sensing portion on a semiconductor substrate having a main semiconductor element.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device, comprising:
a semiconductor substrate containing a semiconductor material having a bandgap wider than that of silicon, and having a first main surface and a second main surface opposite to the first main surface, the semiconductor substrate having first and second effective regions and a non-operating region that excludes the first and second effective regions;
a first first-conductivity-type region of a first conductivity type, provided in the semiconductor substrate;
a first second-conductivity-type region of a second conductivity type, provided between the first main surface of the semiconductor substrate and the first first-conductivity-type region;
a first insulated gate field effect transistor, provided in the first effective region and having the first first-conductivity-type region as a drift region and the first second-conductivity-type region as a base region, the first insulated gate field effect transistor being constituted by a plurality of unit cells each having a cell structure;
a first source pad of the first insulated gate field effect transistor, provided on the first main surface of the semiconductor substrate and electrically connected to the first second-conductivity-type region;
a second second-conductivity-type region of the second conductivity type, provided between the first main surface of the semiconductor substrate and the first first-conductivity-type region, in a region of the semiconductor substrate different from the first second-conductivity-type region;
a second insulated gate field effect transistor, provided in the second effective region, and having the first first-conductivity-type region as a drift region and having the second second-conductivity-type region as a base region, the second insulated gate field effect transistor being constituted by a plurality of unit cells each having a cell structure that is the same as the cell structure of the each of the plurality of unit cells of the first insulated gate field effect transistor, a total number of the plurality of unit cells of the second insulated gate field effect transistor being smaller than a total number of the plurality of unit cells of the first insulated gate field effect transistor;
a second source pad of the second insulated gate field effect transistor, provided on the first main surface of the semiconductor substrate, and disposed to be separate from the first source pad and electrically connected to the second second-conductivity-type region;

a third second-conductivity-type region of the second conductivity type, provided in the non-operating region, between the first main surface of the semiconductor substrate and the first first-conductivity-type region, and electrically connected to the first second-conductivity-type region, the third second-conductivity-type region being separate from the second effective region and surrounding a periphery of the second effective region;

a drain electrode common to the first insulated gate field effect transistor and the second insulated gate field effect transistor, the drain electrode being electrically connected to the second main surface of the semiconductor substrate; and a fourth second-conductivity-type region of the second conductivity type, provided between the first main surface of the semiconductor substrate and the first first-conductivity-type region, the fourth second-conductivity-type region configuring the plurality of unit cells of first insulated gate field effect transistor and having a total dose of impurities that is higher than a total dose of impurities of the third second-conductivity-type region, wherein the fourth second-conductivity-type region includes the first second-conductivity-type region.

2. The semiconductor device according to claim 1, further comprising:

a plurality of trenches each penetrating the first second-conductivity-type region from the first main surface of the semiconductor substrate and reaching the first first-conductivity-type region; and a plurality of second-conductivity-type high-concentration regions of the second conductivity type, respectively provided between trenches that are adjacent to one another among the plurality of trenches and between the first second-conductivity-type region and the first first-conductivity-type region so as to be in contact with the first second-conductivity-type region and the first first-conductivity-type region, each of the plurality of second-conductivity-type high-concentration regions having an impurity concentration that is higher than an impurity concentration of the first second-conductivity-type region, wherein the fourth second-conductivity-type region is configured by the first second-conductivity-type region and the plurality of second-conductivity-type high-concentration regions.

3. The semiconductor device according to claim 1, wherein the total dose of impurities in the third second-conductivity-type region is at most 15% of the total dose of impurities in the fourth second-conductivity-type region.

4. The semiconductor device according to claim 3, wherein the total dose of impurities in the third second-conductivity-type region is at most 5% of the total dose of impurities in the fourth second-conductivity-type region.

5. The semiconductor device according to claim 1, wherein a distance between the second second-conductivity-type region and the third second-conductivity-type region is at least 0.1 µm.

6. The semiconductor device according to claim 1, wherein the second effective region corresponds to a part of a region directly beneath the second source pad, and the third second-conductivity-type region is provided in a region directly beneath the second source pad, excluding the second effective region.

7. The semiconductor device according to claim 1, wherein the second insulated gate field effect transistor detects overcurrent flowing in the first insulated gate field effect transistor.

8. A semiconductor device, comprising:

a semiconductor substrate containing a semiconductor material having a bandgap wider than that of silicon, and having a first main surface and a second main surface opposite to the first main surface, the semiconductor substrate having first and second effective regions and a non-operating region that excludes the first and second effective regions;

a first first-conductivity-type region of a first conductivity type, provided in the semiconductor substrate;

a first second-conductivity-type region of a second conductivity type, provided between the first main surface of the semiconductor substrate and the first first-conductivity-type region;

a first insulated gate field effect transistor, provided in the first effective region and having the first first-conductivity-type region as a drift region and the first second-conductivity-type region as a base region, the first insulated gate field effect transistor being constituted by a plurality of unit cells each having a cell structure;

a first source pad of the first insulated gate field effect transistor, provided on the first main surface of the semiconductor substrate and electrically connected to the first second-conductivity-type region;

a second second-conductivity-type region of the second conductivity type, provided between the first main surface of the semiconductor substrate and the first first-conductivity-type region, in a region of the semiconductor substrate different from the first second-conductivity-type region;

a second insulated gate field effect transistor, provided in the second effective region, and having the first first-conductivity-type region as a drift region and having the second second-conductivity-type region as a base region, the second insulated gate field effect transistor being constituted by a plurality of unit cells each having a cell structure that is the same as the cell structure of the each of the plurality of unit cells of the first insulated gate field effect transistor, a total number of the plurality of unit cells of the second insulated gate field effect transistor being smaller than a total number of the plurality of unit cells of the first insulated gate field effect transistor;

a second source pad of the second insulated gate field effect transistor, provided on the first main surface of the semiconductor substrate, and disposed to be separate from the first source pad and electrically connected to the second second-conductivity-type region;

a third second-conductivity-type region of the second conductivity type, provided in the non-operating region, between the first main surface of the semiconductor substrate and the first first-conductivity-type region, and electrically connected to the first second-conductivity-type region, the third second-conductivity-type region being separate from the second effective region and surrounding a periphery of the second effective region;

a drain electrode common to the first insulated gate field effect transistor and the second insulated gate field effect transistor, the drain electrode being electrically connected to the second main surface of the semiconductor substrate; and a fourth second-conductivity-type region of the second conductivity type, provided between the first main surface of the semiconductor substrate and the first first-conductivity-type region, the fourth second-conductivity-type region configuring the plurality of unit cells of first insulated gate field effect transistor and having a total dose of impurities that is higher than a total dose of impurities of the third second-conductivity-type region, wherein the third second-conductivity-type region has:
- a fifth second-conductivity-type region surrounding a periphery of the second effective region, and
- a sixth second-conductivity-type region in contact with the fifth second-conductivity-type region and surrounding a periphery of the fifth second-conductivity-type region, wherein the fifth second-conductivity-type region has a total dose of impurities that is lower than a total dose of impurities in the sixth second-conductivity-type region.

9. The semiconductor device according to claim 8, wherein
the total dose of impurities in the fifth second-conductivity-type region is lower than the total dose of impurities in the fourth second-conductivity-type region.

10. The semiconductor device according to claim 9, wherein
the total dose of impurities of the fifth second-conductivity-type region is at most 15% of the total dose of impurities of the fourth second-conductivity-type region.

11. The semiconductor device according to claim 10, wherein
the total dose of impurities in the fifth second-conductivity-type region is at most 5% of the total dose of impurities in the fourth second-conductivity-type region.

12. A semiconductor device, comprising:
a semiconductor substrate containing a semiconductor material having a bandgap wider than that of silicon, and having a first main surface and a second main surface opposite to the first main surface, the semiconductor substrate having first and second effective regions and a non-operating region that excludes the first and second effective regions;
a first first-conductivity-type region of a first conductivity type, provided in the semiconductor substrate;
a first second-conductivity-type region of a second conductivity type, provided between the first main surface of the semiconductor substrate and the first first-conductivity-type region;
a first insulated gate field effect transistor, provided in the first effective region and having the first first-conductivity-type region as a drift region and the first second-conductivity-type region as a base region, the first insulated gate field effect transistor being constituted by a plurality of unit cells each having a cell structure;
a first source pad of the first insulated gate field effect transistor, provided on the first main surface of the semiconductor substrate and electrically connected to the first second-conductivity-type region;
a second second-conductivity-type region of the second conductivity type, provided between the first main surface of the semiconductor substrate and the first first-conductivity-type region, in a region of the semiconductor substrate different from the first second-conductivity-type region;
a second insulated gate field effect transistor, provided in the second effective region, and having the first first-conductivity-type region as a drift region and having the second second-conductivity-type region as a base region, the second insulated gate field effect transistor being constituted by a plurality of unit cells each having a cell structure that is the same as the cell structure of the each of the plurality of unit cells of the first insulated gate field effect transistor, a total number of the plurality of unit cells of the second insulated gate field effect transistor being smaller than a total number of the plurality of unit cells of the first insulated gate field effect transistor;
a second source pad of the second insulated gate field effect transistor, provided on the first main surface of the semiconductor substrate, and disposed to be separate from the first source pad and electrically connected to the second second-conductivity-type region;
a third second-conductivity-type region of the second conductivity type, provided in the non-operating region, between the first main surface of the semiconductor substrate and the first first-conductivity-type region, and electrically connected to the first second-conductivity-type region, the third second-conductivity-type region being separate from the second effective region and surrounding a periphery of the second effective region;
a drain electrode common to the first insulated gate field effect transistor and the second insulated gate field effect transistor, the drain electrode being electrically connected to the second main surface of the semiconductor substrate;
a fourth second-conductivity-type region of the second conductivity type, provided between the first main surface of the semiconductor substrate and the first first-conductivity-type region, the fourth second-conductivity-type region configuring the plurality of unit cells of first insulated gate field effect transistor and having a total dose of impurities that is higher than a total dose of impurities of the third second-conductivity-type region; and
a second first-conductivity-type region of the first conductivity-type, provided between the second second-conductivity-type region and the third second-conductivity-type region, the second first-conductivity-type region surrounding a periphery of the second second-conductivity-type region.

13. The semiconductor device according to claim 12, further comprising
at least one electrode pad provided on the first main surface of the semiconductor substrate, in the non-operating region, the least one electrode pad being provided to be separate from the first source pad and the second source pad, wherein
the third second-conductivity-type region spans an entire area of a region of the non-operating region excluding the second first-conductivity-type region, the third second-conductivity-type region being positioned directly beneath the at least one electrode pad.

* * * * *